United States Patent
Cok

(10) Patent No.: US 8,895,429 B2
(45) Date of Patent: Nov. 25, 2014

(54) MICRO-CHANNEL STRUCTURE WITH VARIABLE DEPTHS

(71) Applicant: Ronald Steven Cok, Rochester, NY (US)

(72) Inventor: Ronald Steven Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/784,869

(22) Filed: Mar. 5, 2013

(65) Prior Publication Data
US 2014/0251661 A1   Sep. 11, 2014

(51) Int. Cl.
*H01L 21/44* (2006.01)
*H05K 1/02* (2006.01)

(52) U.S. Cl.
CPC .................................. *H05K 1/0296* (2013.01)
USPC ................. 438/609; 438/11; 438/53; 257/48; 257/98; 257/99; 257/E21.521

(58) Field of Classification Search
USPC .......... 257/48, 98–99, 419, E21.521; 438/11, 438/53
See application file for complete search history.

(56) References Cited

U.S. PATENT DOCUMENTS

| | | | |
|---|---|---|---|
| 6,645,444 B2 | 11/2003 | Goldstein | |
| 8,179,381 B2 | 5/2012 | Frey et al. | |
| 2006/0057502 A1 | 3/2006 | Okada et al. | |
| 2010/0026664 A1 | 2/2010 | Geaghan | |
| 2010/0328248 A1 | 12/2010 | Mozdzyn | |
| 2011/0007011 A1 | 1/2011 | Mozdzyn | |
| 2012/0226130 A1* | 9/2012 | De Graff et al. | 600/393 |
| 2013/0278545 A1* | 10/2013 | Cok et al. | 345/174 |

FOREIGN PATENT DOCUMENTS

CN    102063951    5/2011

\* cited by examiner

*Primary Examiner* — Mark A Laurenzi
(74) *Attorney, Agent, or Firm* — Raymond L. Owens

(57) ABSTRACT

A micro-channel structure having variable depths includes a substrate and a cured layer formed on the substrate. At least first and second micro-channels are embossed in the cured layer. The first micro-channel has a bottom surface defining a first depth and the second micro-channel has a bottom surface defining a second depth different from the first depth. A cured electrical conductor is making a micro-wire is formed in each of the first and second micro-channels over their respective bottom surfaces.

18 Claims, 29 Drawing Sheets

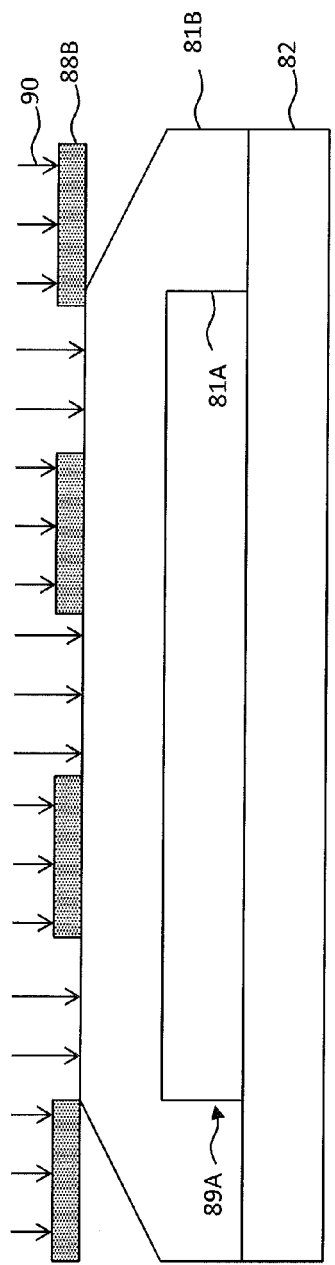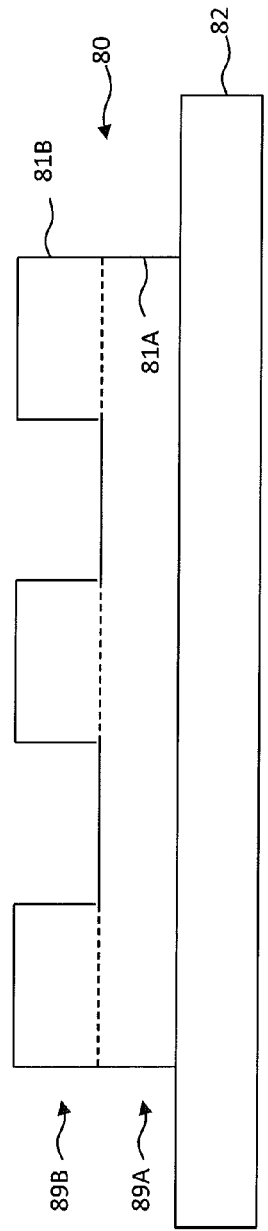
FIG. 21F
FIG. 21G

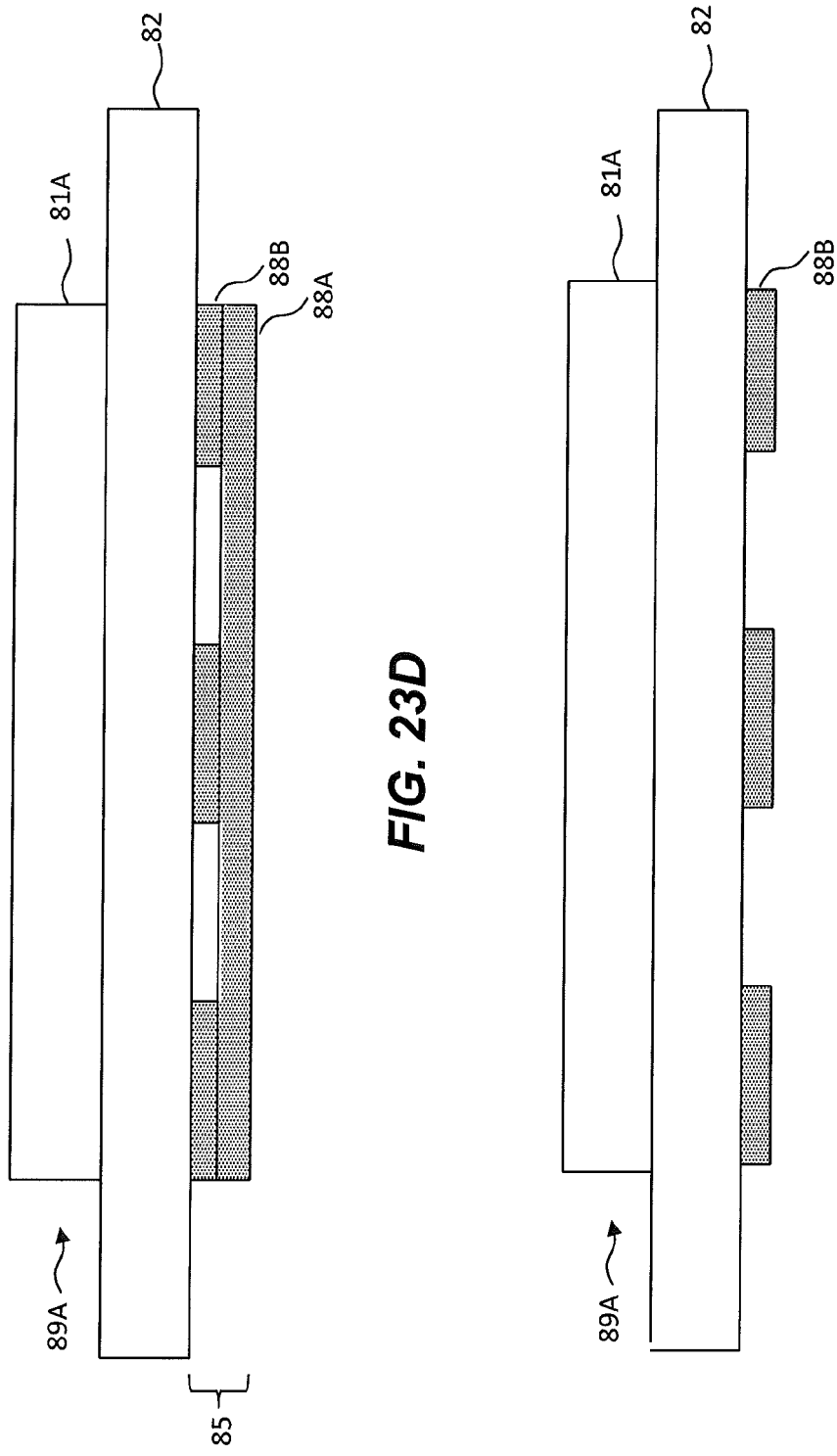

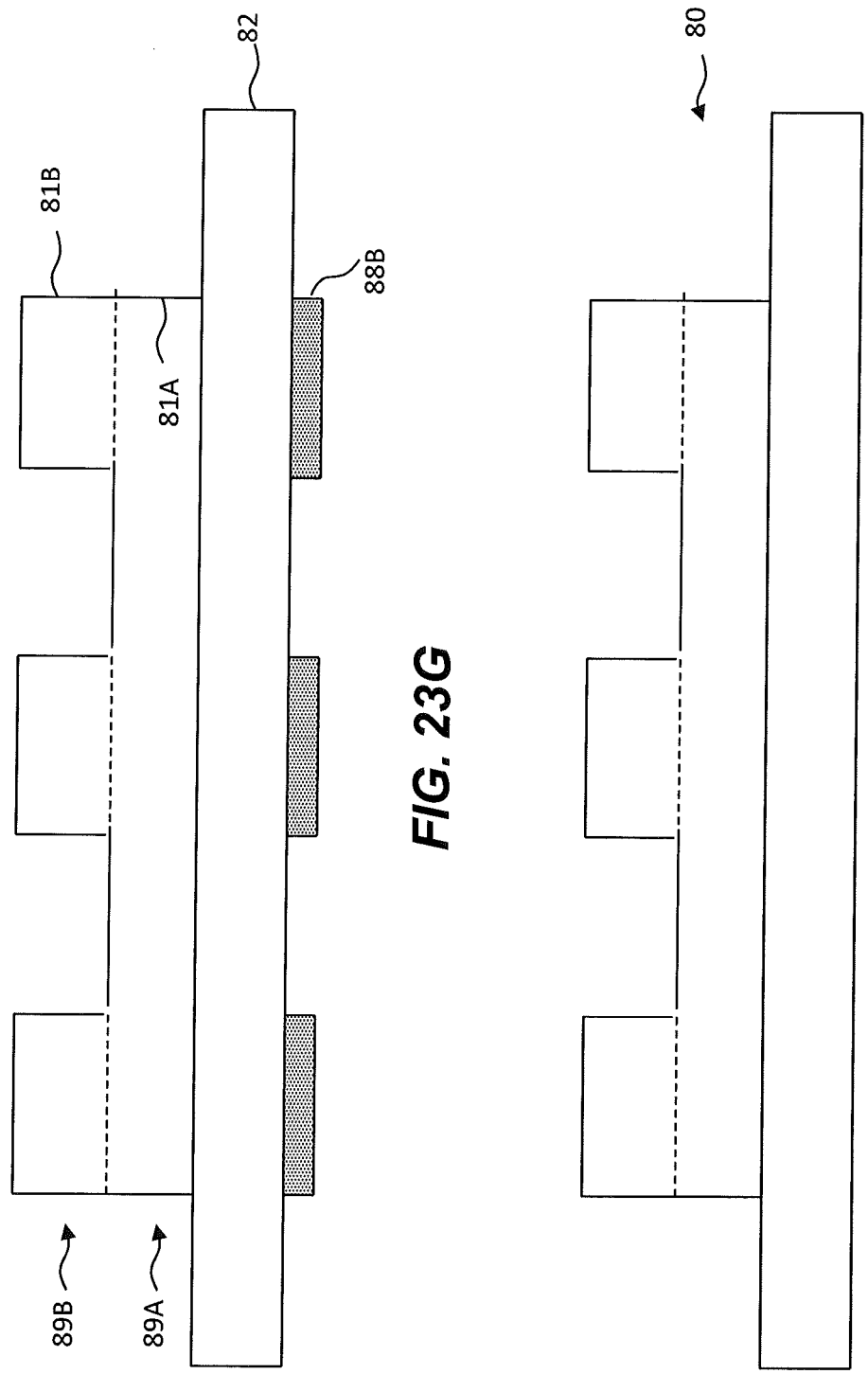

MICRO-CHANNEL STRUCTURE WITH VARIABLE DEPTHS

CROSS REFERENCE TO RELATED APPLICATIONS

Reference is made to commonly-assigned, U.S. patent application Ser. No. 13/784,866 filed Mar. 5, 2013, entitled "Variable-Depth Micro-Channel Structure" by Ronald S. Cok; U.S. patent application Ser. No. 13/784,873 filed Mar. 5, 2013, entitled "Micro-Channel with Conductive Particle", by David Trauernicht and Ronald S. Cok; U.S. patent application Ser. No. 13/784,882 filed Mar. 5, 2013, entitled "Micro-Channel Connection Pad", by Ronald S. Cok and David Trauernicht; and U.S. patent application Ser. No. 13/784, 893filed Mar. 5, 2013, entitled "Micro-Channel Connection Method", by Ronald S. Cok and David Trauernicht, the disclosures of which are incorporated herein.

FIELD OF THE INVENTION

The present invention relates to transparent electrodes having micro-wires formed in micro-channels and in particular to the micro-channel structure.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass.

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes including very fine patterns of conductive elements, such as metal wires or conductive traces are known. For example, U.S. Patent Publication No. 2011/0007011 teaches a capacitive touch screen with a mesh electrode, as does U.S. Patent Publication No. 2010/0026664.

It is known in the prior art to form conductive traces including nano-particles, for example silver nano-particles. The synthesis of such metallic nano-crystals is known. Issued U.S. Pat. No. 6,645,444 entitled "Metal nano-crystals and synthesis thereof" describes a process for forming metal nano-crystals optionally doped or alloyed with other metals. U.S. Patent Application Publication No. 2006/0057502 entitled "Method of forming a conductive wiring pattern by laser irradiation and a conductive wiring pattern" describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains.

More recently, transparent electrodes including very fine patterns of conductive micro-wires have been proposed. For example, capacitive touch-screens with mesh electrodes including very fine patterns of conductive elements, such as metal wires or conductive traces, are taught in U.S. Patent Application Publication No. 2010/0328248 and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between 0.5µ and 4µ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels can be formed in a substrate using an embossing technique. Embossing methods are generally known in the prior art and typically include coating a curable liquid, such as a polymer, onto a rigid substrate. A pattern of micro-channels is embossed (impressed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

There is a need, however, for further improvements in conductivity, transparency, connectivity, and manufacturability for micro-wire transparent electrodes and the substrates in which they are formed.

SUMMARY OF THE INVENTION

In accordance with the present invention, a micro-channel structure having variable depths comprises:
a substrate;
a cured layer formed on the substrate, the cured layer having at least first and second micro-channels embossed therein, the first micro-channel having a bottom surface defining a first depth and the second micro-channel having a bottom surface defining a second depth different from the first depth; and a cured electrical conductor forming a micro-wire in each of the first and second micro-channels over their respective bottom surfaces.

The present invention provides a transparent electrode with improved transparency, conductivity, connectivity, and manufacturability. The transparent electrodes of the present invention are particularly useful in capacitive touch screen and display devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 21A-21G illustrate time-sequential cross sections showing the construction of a multi-depth stamp according to an embodiment of the present invention;

FIGS. 23A-23H illustrate time-sequential cross sections showing the construction of a multi-depth stamp according to an embodiment of the present invention.

The Figures are not drawn to scale since the variation in size of various elements in the Figures is too great to permit depiction to scale.

DETAILED DESCRIPTION OF THE INVENTION

The present invention is directed toward electrically conductive micro-wires formed in micro-channel structures in a substrate. The micro-wires are electrically connected to electrical connectors with improved transparency and conductivity. The micro-channel structures also facilitate electrical connection to electronic components external to the substrate on which the micro-channel structures are formed, providing improved connectivity and manufacturability. Such electronic components provide electrical connection and control to electrical conductors formed in micro-channel structures.

Figure 1:
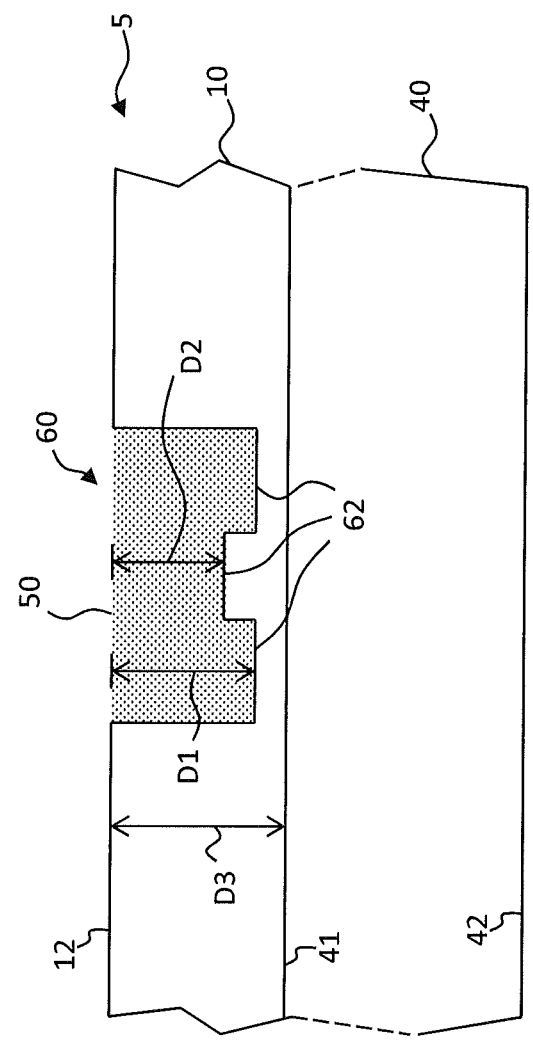
FIGS. 1-4 are cross sections of variable-depth micro-channels according to various embodiments of the present invention.

Referring to FIG. 1 in an embodiment of the present invention, a micro-channel structure 5 includes a substrate 40 having a first surface 41 and an opposing second surface 42. A cured layer 10 having a cured-layer depth D3 is formed on first surface 41 of substrate 40. Cured layer 10 has one or more micro-channels 60 embossed therein. Micro-channel 60 extends from a cured-layer surface 12 of cured layer 10 to a micro-channel bottom 62 of micro-channel 60. Micro-channel bottom 62 defines two or more different first and second micro-channel depths D1 and D2 of micro-channel 60.

In a further embodiment, a cured electrical conductor forms a micro-wire 50 in micro-channel 60 over surface of micro-channel bottom 62 and extending across at least a portion of the surface of micro-channel bottom 62 of micro-channel 60.

In an embodiment, cured-layer depth D3 of cured layer 10 can have a range of about two microns to ten microns greater than first or second micro-channel depths D1 or D2 of micro-channel 60.

As used herein, a depth is also considered to be a thickness. Thus, the thickness of micro-channel 60 is also first micro-channel depth D1 or second micro-channel D2 of micro-channel 60. The thickness of cured layer 10 is also cured-layer depth D3 of cured layer 10.

Cured layer 10 is a layer of curable material that has been cured. For example, cured layer 10 is formed of a curable material coated or otherwise deposited on first surface 41 of substrate 40 to form curable layer 10 and then cured to form a cured layer 10. The substrate-coated curable material is considered herein to be curable layer 10 before it is cured and cured layer 10 after it is cured. Similarly, cured electrical conductor 50 is an electrical conductor formed by locating a curable material in micro-channel 60 and curing the curable material to form the cured electrical conductor in micro-channel 60. The cured electrical conductor is a micro-wire 50.

In an embodiment, cured layer 10 is a layer that is embossed in a single step and cured in a single step. In an embodiment, the embossing step and the curing step are different single steps. For example, curable layer 10 is embossed in a first step using a stamping method known in the art and cured in a second different step, e.g. by heat or exposure to radiation. In another embodiment, embossing and curing curable layer 10 is done in a single common step. Curable layer 10 is deposited as a single layer in a single step using coating methods known in the art, e.g. curtain coating. In an alternative embodiment, curable layer 10 is deposited as multiple sub-layers in a single step using multi-layer deposition methods known in the art, e.g. multi-layer slot coating, repeated curtain coatings, or multi-layer extrusion coating. In yet another embodiment, curable layer 10 includes multiple sub-layers formed in different, separate steps, for example with a multi-layer extrusion, curtain coating, or slot coating machine as is known in the coating arts. Micro-channel 60 is embossed and cured in curable layer 10 in a single step and micro-wires 50 are formed by depositing a curable conductive ink in micro-channels 60 and curing the curable conductive ink to form an electrically conductive micro-wire 50.

Cured layer 10 useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated. When a molding device, such as an embossing stamp having an inverse micro-channel structure is applied to liquid curable material in curable layer 10 coated on substrate 40 and the cross-linking agents in the curable material are activated, the liquid curable material in curable layer 10 is hardened into cured layer 10 having micro-channels 60. The liquid curable materials can include a surfactant to assist in controlling coating on substrate 40. Materials, tools, and methods are known for embossing coated liquid curable materials to form cured layers 10 having conventional single-layer micro-channels.

Similarly, curable inks useful in the present invention are known and can include conductive inks having electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in micro-channels 60 and cured, for example by heating or exposure to radiation such as infra-red, visible light, or ultra-violet radiation. The curable ink hardens to form the cured ink that makes up micro-wires 50. For example, a curable conductive ink with conductive nano-particles is located within micro-channels 60 and heated to agglomerate or sinter the nano-particles, thereby forming an electrically conductive micro-wire 50. Materials, tools, and methods are known for coating liquid curable inks to form micro-wires 50 in conventional single-layer micro-channels.

It has been experimentally demonstrated that micro-wires formed by curing liquid curable inks coated into relatively wide (for example wider than 20 microns, 40 microns, or 60 microns) can have a problematic shape and distribution. In some experimental examples, such wide micro-wires do not extend over the entire micro-channel bottom of a wide conventional single-layer micro-channel and can form separate conductors on either side of a wide conventional single-layer micro-channel against the walls of the wide conventional single-layer micro-channel. Alternatively, wide micro-wires do not extend up to cured-layer surface, inhibiting electrical connection to micro-wires with an electrical connector.

In embodiments of the present invention, by providing a micro-channel 60 having a variable depth, a liquid curable ink coated into relatively wide micro-channel 60 is distributed more evenly across micro-channel bottom 62 of the relatively wide micro-channel 60. The improved distribution maintains conductivity of micro-wire 50 in relatively wide micro-channel 60 and facilitates electrical connectivity to micro-wire 50 with an electrical connector 70 (shown in FIGS. 5 and 9 and discussed further below). Thus, in an embodiment of the present invention, the cured electrical conductor extends across the surface of each micro-channel bottom 62.

Figure 2:
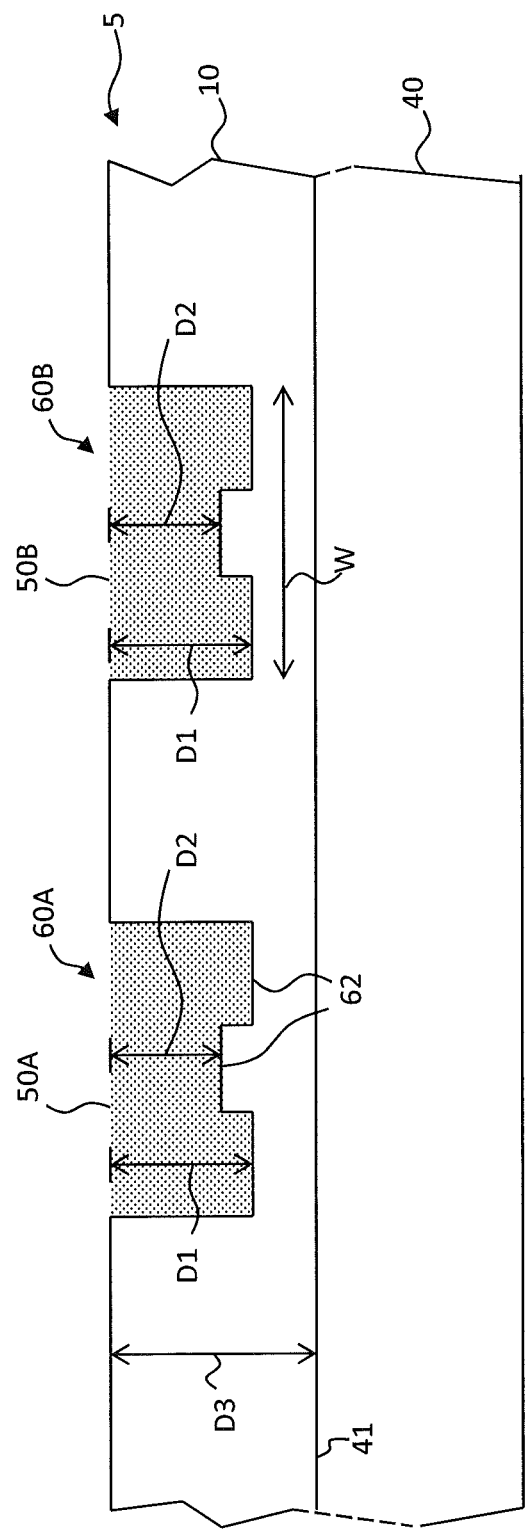

In a further embodiment of the present invention, referring to FIG. 2, a plurality of micro-channels 60A and 60B are embossed in cured layer 10 on first surface 41 of substrate 40 to form micro-channel structure 5. A micro-wire 50A, 50B is formed in each micro-channel 60A, 60B respectively. In an embodiment, each micro-channel 60A, 60B in the plurality of micro-channels 60A, 60B has a surface of micro-channel bottom 62 defining two or more different micro-channel depths D1 and D2.

In various embodiments of the present invention, depth D1 or D2 of micro-channel 60A, 60B is in the range of about ten microns to two microns. A width W of micro-channel 60A, 60B is in the range of about twelve microns to two microns. Cured-layer depth D3 of cured layer 10 is in the range of about twelve microns to four microns. In another embodiment, micro-channel 60A, 60B has first or second micro-channel depth D1, D2 in a range of two microns to ten microns less than cured-layer depth D3.

Figure 3:
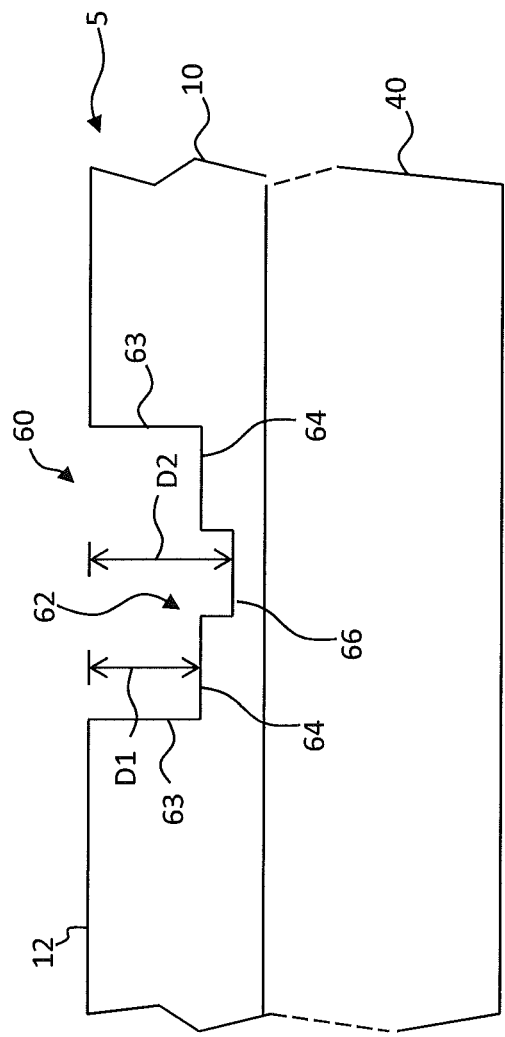
Figure 5:
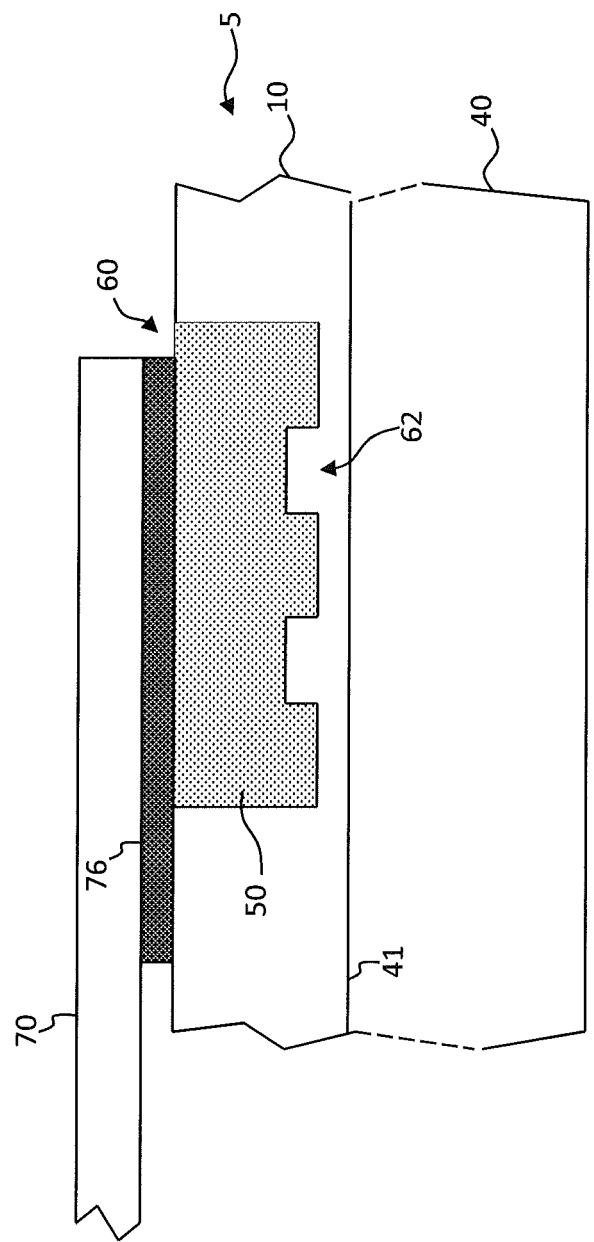
FIG. 5 is a cross section of an embodiment of the present invention including an electrical connector.

In a further embodiment of the present invention, referring to FIG. 3, micro-channel structure 5 formed in cured-layer 10 on substrate 40 includes micro-channel 60 with micro-channel edges 63 adjacent to each side of micro-channel 60. First portions 64 of the surface of micro-channel bottom 62 have first micro-channel depth D1 adjacent to micro-channel edges 63, and a second portion 66 of the surface of micro-channel bottom 62 between first portions 64 having a second micro-channel depth D2. In the embodiment illustrated in FIG. 3, first micro-channel depth D1 is less than second micro-channel depth D2. Referring to FIG. 5 (discussed further below) in an alternative embodiment first micro-channel depth D1 is greater than second micro-channel depth D2.

In other embodiments, first portion 64 has a surface substantially parallel to cured-layer surface 12, second portion 66 has a surface substantially parallel to cured-layer surface 12, or first portion 64 has a surface substantially parallel to a surface of second portion 66.

Figure 4:
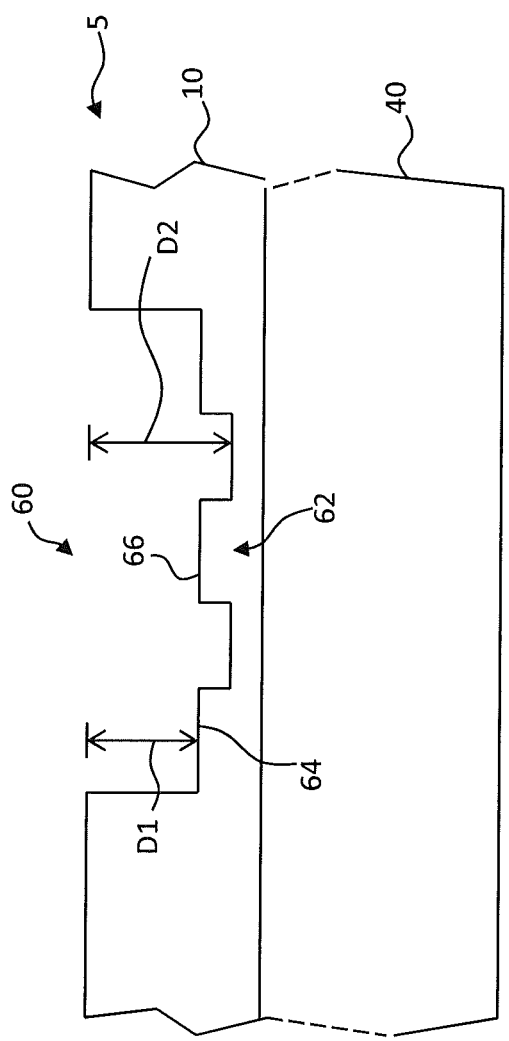

Referring to FIG. 4, in other embodiments of micro-channel structures 5 of the present invention, micro-channel 60 formed in cured layer 10 on substrate 40 has three or more first portions 64 of the surface of micro-channel bottom 62 with first micro-channel depth D1 and two or more second portions 66 with second micro-channel depth D2. Each first portion is separated from other first portions and each second portion is separated from other second portions.

Referring to FIG. 5, in another embodiment, electrical connector 70 is electrically connected to micro-wire 50. Electrical connector 70 can include metal and be soldered, sintered, or welded to cured electrical conductor micro-wire 50, for example by providing electrical connector 70 in contact with micro-wire 50 and heating electrical connector 70 and micro-wire 50. In an alternative embodiment, as shown in FIG. 5, a conductive paste 76 (for example a solder paste) is provided between micro-wire 50 and electrical connector 70 and heated to electrically connect micro-wire 50 to electrical connector 70. The surface of micro-channel bottom 62 of micro-channel 60 formed in cured layer 10 on first surface 41 of substrate 40 can have a variable depth. Such electrical connector 70 can provide an electrical connection between electronic components (not shown) external to micro-channel structure 5 and micro-wire 50.

Figure 6:
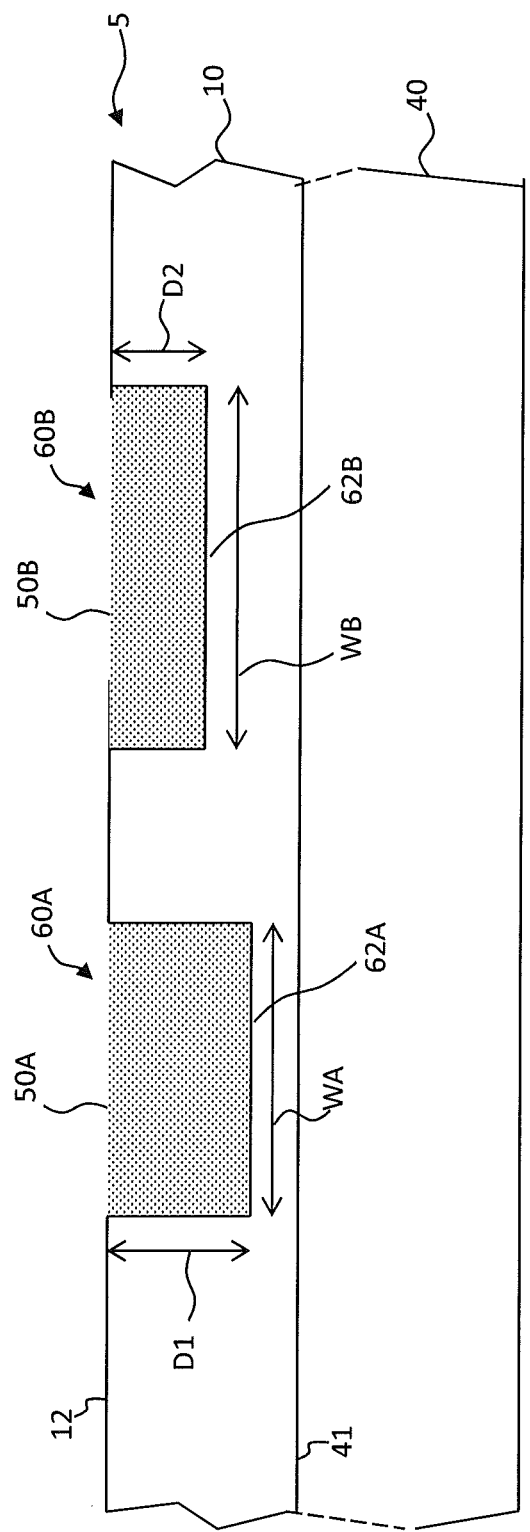
FIGS. 6-7 are cross sections of embodiments of the present invention having micro-channels of different depths and widths.

In an alternative embodiment illustrated in FIG. 6, a micro-channel structure 5 having variable depths includes cured layer 10 formed on first surface 41 of substrate 40. Micro-channels 60A, 60B are embossed in cured layer 10 and extend from cured-layer surface 12 toward first surface 41 of substrate 40 in cured layer 10. Micro-channel 60A has a surface of micro-channel bottom 62A defining first depth D1 and micro-channel 60B having a surface of micro-channel bottom 62B defining second micro-channel depth D2 different from first micro-channel depth D1. The cured electrical conductor forms a micro-wire 50A, 50B in each of micro-channels 60A, 60B over at least a portion of their respective surfaces of micro-channel bottoms 62A, 62B. In an embodiment, either micro-channel 60A or 60B can have a variable-depth micro-channel bottom 62 as illustrated in FIGS. 1-5. In another embodiment, the cured electrical conductor of micro-channel 60A or 60B extends across the surface of each micro-channel bottom 62A, 62B, respectively.

Figure 7:
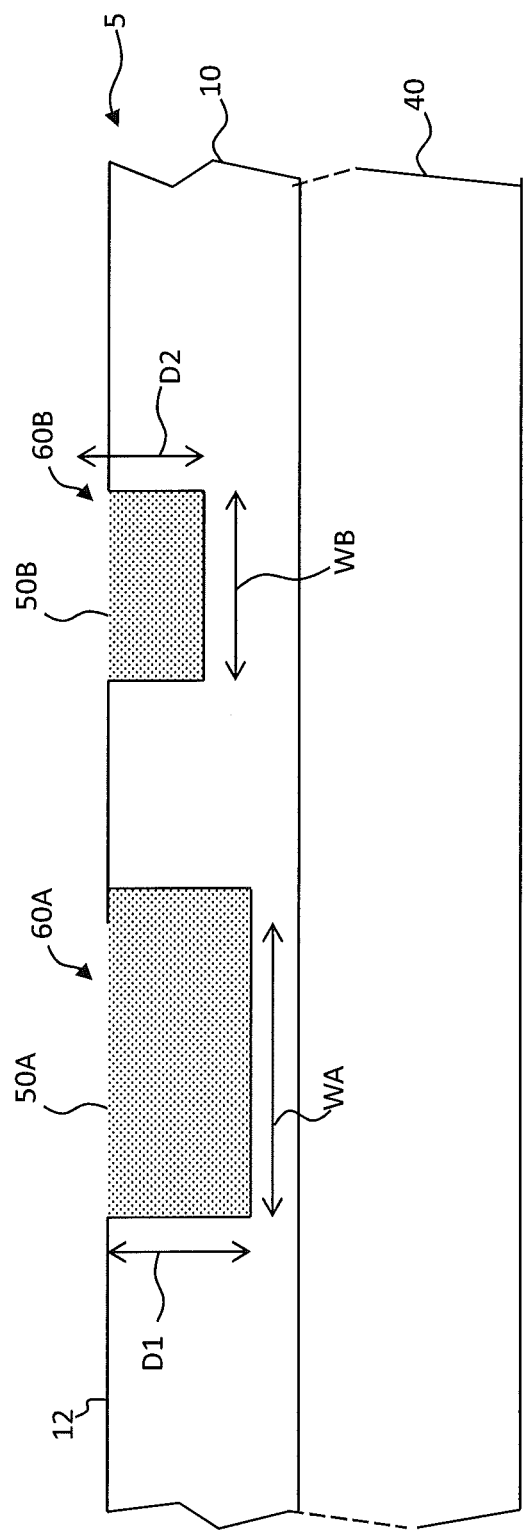

According to various embodiments of the present invention, first micro-channel depth D1 is greater than second micro-channel depth D2 and micro-channel 60B has a width WB greater than a width WA of micro-channel 60A. Alternatively, as shown in FIG. 7, micro-channel structure 5 has micro-channels 60A, 60B formed in cured layer 10 on substrate 40 and first micro-channel depth D1 of micro-channel 60A is greater than second micro-channel depth D2 of micro-channel 60B and micro-channel 60A has width WA greater than width WB of micro-channel 60B.

In other embodiments, the surface of micro-channel bottom 62A of micro-channel 60A is substantially parallel to cured-layer surface 12, the surface of micro-channel bottom 62B of micro-channel 60B is substantially parallel to cured-layer surface 12, or the surface of micro-channel bottom 62A of micro-channel 60A is substantially parallel to the surface of micro-channel bottom 62B of micro-channel 60B.

Figure 8A:
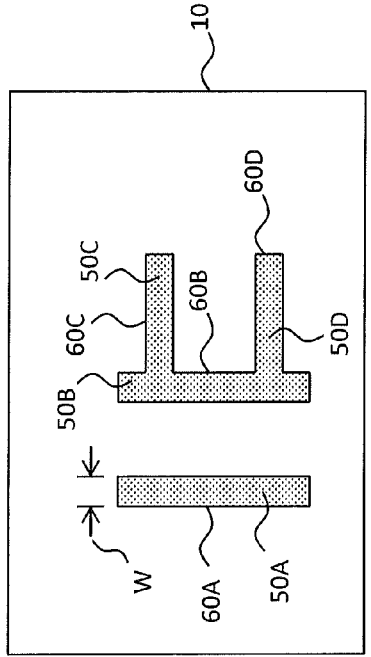
FIG. 8A is a plan view of an embodiment of the present invention having electrically independent and electrically common micro-channels.

Referring to FIG. 8A in other embodiments, micro-channels 60A, 60B, 60C, and 60D formed in cured-layer 10 have micro-wires 50A, 50B, 50C, and 50D formed in micro-channels 60A, 60B, 60C, and 60D respectively. Micro-channel 60A does not intersect micro-channels 60B, 60C, or 60D and micro-wire 50A is electrically separate from micro-wires 50B, 50C, or 50D. Micro-channels 60C and 60D intersect micro-channel 60B so that micro-wires 50B, 50C, and 50D are electrically continuous. Each of micro-channels 60A, 60B, 60C, and 60D can have different depths or have a variable depth (e.g. as illustrated in FIG. 1). Thus, micro-channels 60B, 60C, or 60D could be considered as one micro-channel having different depths in various portions of the micro-channel. In contrast, micro-channel 60 of FIG. 2 has different depths along a cross section width W of micro-channel 60. Thus, referring to FIG. 8B, a single micro-channel 60 formed in cured layer 10 on substrate 40 having a single electrically continuous micro-wire 50 can have different micro-channel depths D1, D2 along its length L. Micro-channel portions 61A, 61B having different micro-channel depths D1, D2 along length L of micro-channel 60 can be considered separate intersecting micro-channels (corresponding to micro-channel portions 61A, 61B), each with a different depth (D1, D2 respectively) or a single micro-wire 60 with different micro-channel depths D1, D2. Thus, a micro-channel 60 according to embodiments of the present invention, has different depths D along length L of micro-channel 60, different depths D across the width W of micro-channel 60, or both, or intersects a micro-channel 60 having a different depth.

Figure 8B:
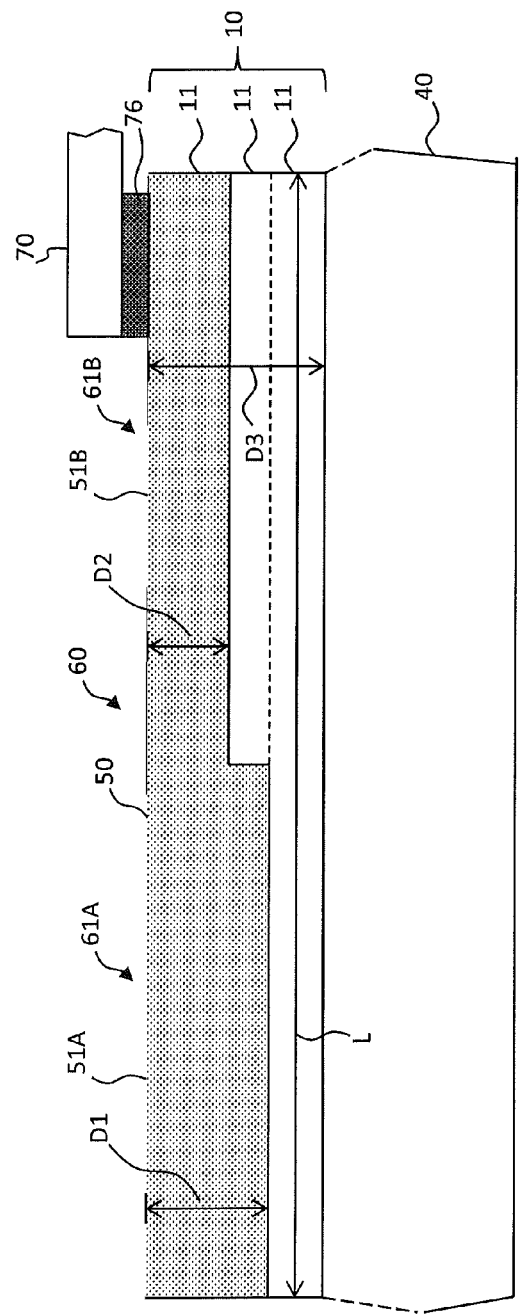
FIG. 8B is cross section along the length of a variable-depth micro-channel of an embodiment of the present invention.

In various embodiments of the present invention referring to both FIGS. 8A and 8B, depth D1 or D2 in micro-wire portions 51A or 51B of micro-channel 60A, 60B, 60C, or 60D is in the range of about ten microns to two microns. A width W of micro-channel 60A, 60B, 60C, or 60D is in the range of about twelve microns to two microns. Cured-layer depth D3 of cured layer 10 is in the range of about twelve microns to four microns. In another embodiment, micro-channel 60A, 60B has a first or second micro-channel depth D1, D2 that is in a range of two microns to ten microns less than cured-layer depth D3.

In further embodiments of the present invention, cured layer 10 has multiple sub-layers 11. Electrical connector 70 is electrically connected to micro-wire 50, for example with a conductive paste 76, so that electrical connector 70 is soldered, sintered, or welded to micro-wire 50.

Figure 9:
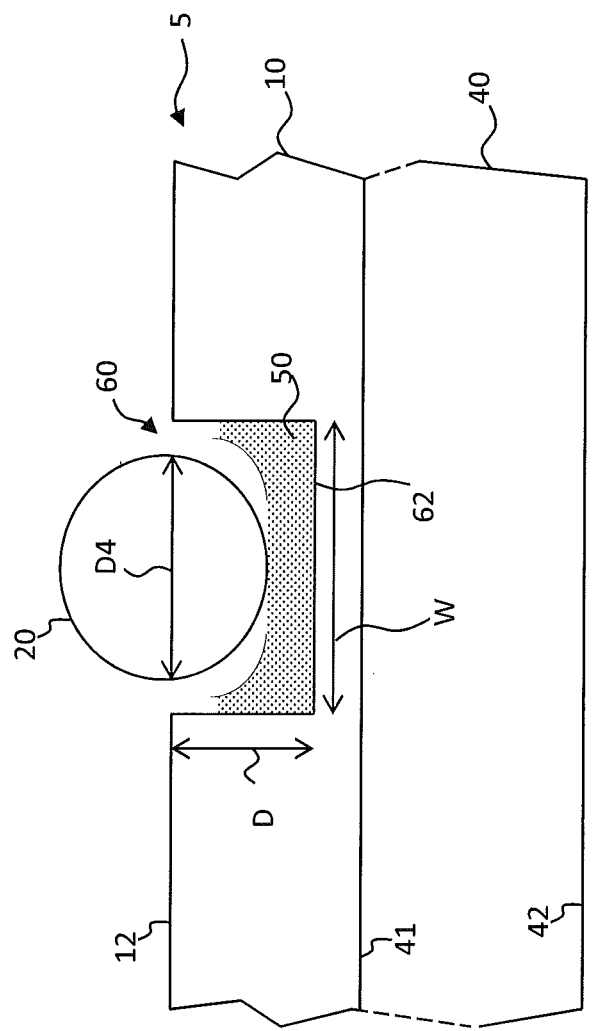
FIGS. 9-10 are cross sections of embodiments of the present invention having a micro-channel and conductive particle.

Referring to FIG. 9 in an alternative embodiment of the present invention, micro-channel structure 5 includes substrate 40 having first surface 41 opposite second surface 42. Cured layer 10 is formed on first surface 41 of substrate 40. Cured layer 10 has cured-layer surface 12 opposite substrate 40 and one or more micro-channels 60 embossed in cured layer 10 defining a surface of micro-channel bottom 62, each micro-channel 60 extending from cured-layer surface 12 into cured layer 10 toward substrate 40. The cured electrical conductor forms a micro-wire 50 in micro-channels 60 and is in contact with the surface of micro-channel bottom 62. A conductive particle 20 is located in at least one micro-channel 60 and is in electrical contact with cured electrical conductor micro-wire 50. As used herein, two or more elements that are in electrical contact are electrically connected, so that an electrical current can flow from any of the elements to any other of the elements in electrical contact.

Conductive particle 20 has a diameter D4 and micro-channel 60 has a micro-channel width W and a micro-channel depth D. In an embodiment of the present invention, cured electrical conductor 50 extends across the width of micro-channel 60 in contact with the surface of micro-channel bottom 62.

According to embodiments of the present invention, conductive particle 20 extends to or above cured-layer surface 12. Micro-channel width W of micro-channel 60 is greater than diameter D4 of conductive particle 20, so that conductive particle 20 can fit into micro-channel 60. In an embodiment, micro-channel depth D of micro-channel 60 is less than diameter D4 of conductive particle 20, so that conductive particle 20 in micro-channel 60 can extend above cured-layer surface 12. In another embodiment (not shown) micro-channel width W of micro-channel 60 is less than diameter D4 of conductive particle 20 but conductive particle 20 can extend into a portion of micro-channel 60. In a further embodiment, conductive particle 20 is substantially spherical. Alternatively, referring to FIG. 10, conductive particle 21 is substantially elongated. Elongated conductive particle 21 can, but need not, have one or more diameters that are less than micro-channel width W so that elongated conductive particle 21 can electrically contact micro-wire 50 adjacent micro-channel bottom 62 of micro-channel 60 formed in cured layer 10 on substrate 40. Elongated conductive particle 21 can be symmetric, as shown, or have an irregular shape (not shown).

Figure 11:
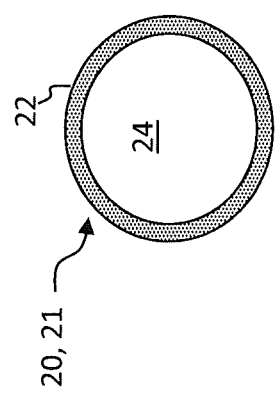
FIG. 11 is a cross section of a conductive particle useful in various embodiments of the present invention.

Conductive particle 20 or elongated conductive particle 21 can include metal or a metal alloy, for example silver, aluminum, gold, titanium, or tin. Alternatively, conductive particle 20 or elongated conductive particle 21 can include conductive polymers. As shown in FIG. 11, conductive particle 20 or elongated conductive particle 21 can have a conductive shell 22 formed around a core 24. Core 24 can be a non-conductive or conductive shell 22 and can be formed around a less-conductive core 24, for example with a metal shell surrounding a conductive polymer core.

Figure 10:
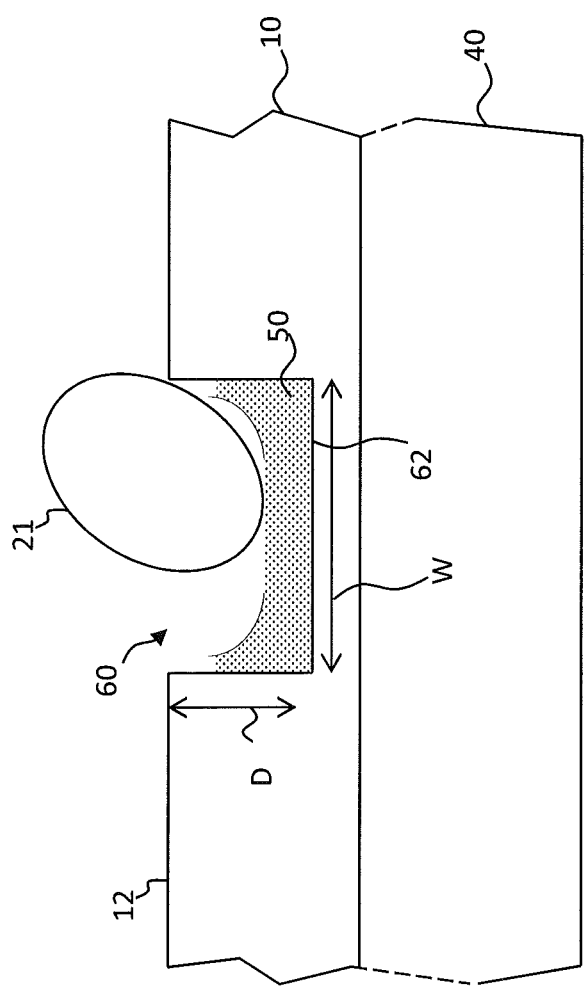
Figure 12:
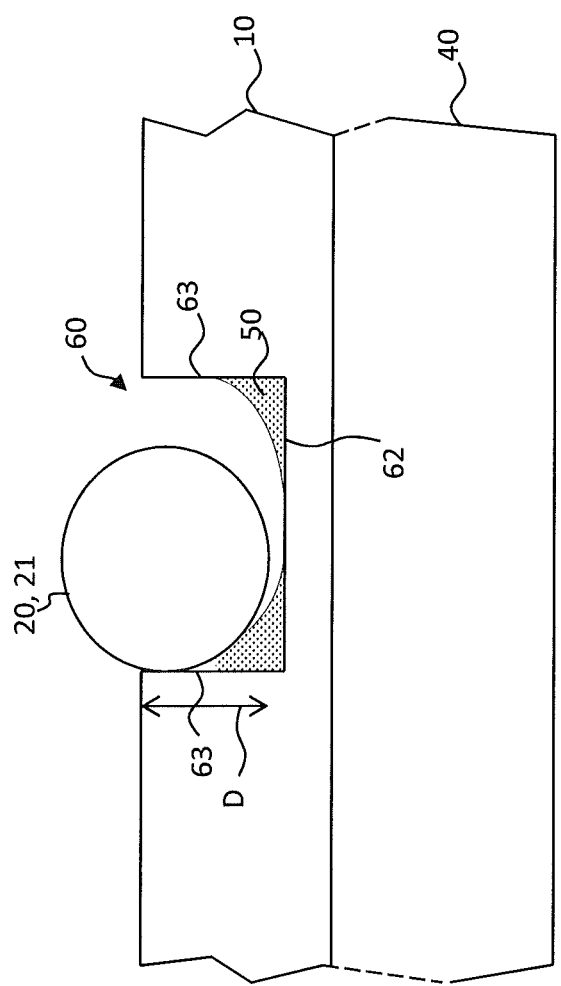
FIGS. 12-13 are cross sections of embodiments of the present invention having a micro-channel and conductive particle.
Figure 13:
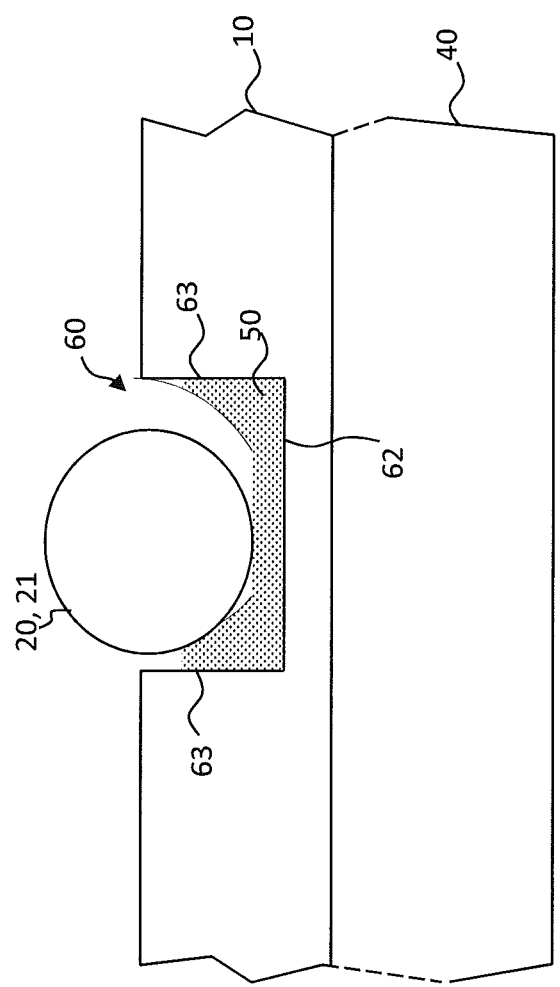

Conductive particle 20 or elongated conductive particle 21 can be in electrical contact with micro-wire 50 at various locations within micro-channel 60. As shown in FIGS. 9 and 10, conductive particle 20 or elongated conductive particle 21 is in electrical contact with micro-wire 50 only adjacent to micro-channel bottom 62. Referring further to FIG. 12, at least one micro-channel 60 formed in cured layer 10 on substrate 40 has micro-channel bottom 62 and micro-channel edges 63. Conductive particle 20 or elongated conductive particle 21 is in electrical contact with micro-wire 50 only adjacent to a micro-channel edge 63. Alternatively, referring to FIG. 13, at least one micro-channel 60 formed in cured layer 10 on substrate 40 has micro-channel bottom 62 and micro-channel edges 63. Conductive particle 20 or elongated conductive particle 21 is in electrical contact with micro-wire 50 adjacent to micro-channel bottom 62 and adjacent to at least one of micro-channel edges 63.

Figure 14:
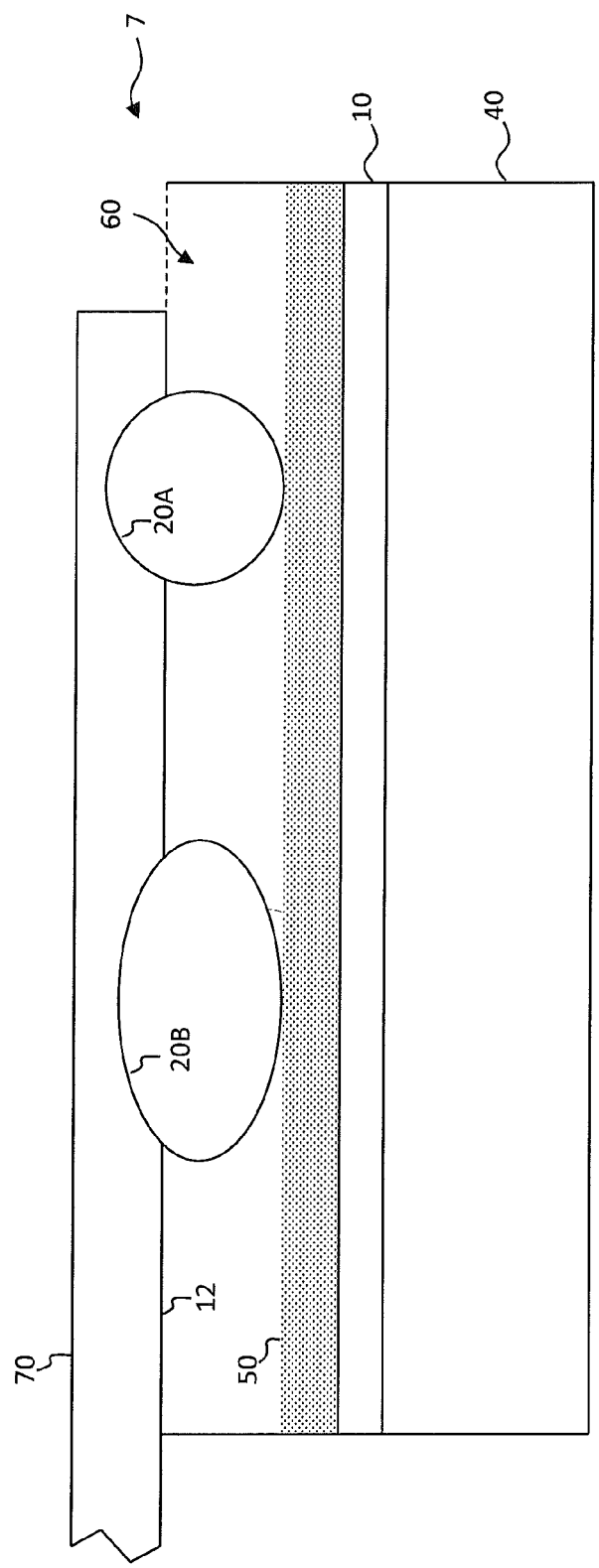
FIG. 14 is a cross section of an embodiment of the present invention including a conductive particle and an electrical connector.

Referring to FIG. 14 in additional embodiments of the present invention, a plurality of conductive particles 20A, 20B have different sizes or shapes that are in electrical contact with micro-wire 50 in a single micro-channel 60 formed in cured layer 10 on substrate 40. Electrical connector 70 is electrically connected to conductive particles 20A, 20B providing an electrical connection between electrical connector 70 and micro-wire 50. Since conductive particles 20A, 20B are in contact with both electrical connector 70 and micro-wire 50, no additional conductors are necessary, although conductive paste (as shown in FIG. 5) could also be used. Conductive particles 20A, 20B can be soldered, sintered, or welded to both electrical connector 70 and micro-wire 50, for example with the application of heat or pressure, or both.

Figure 15:
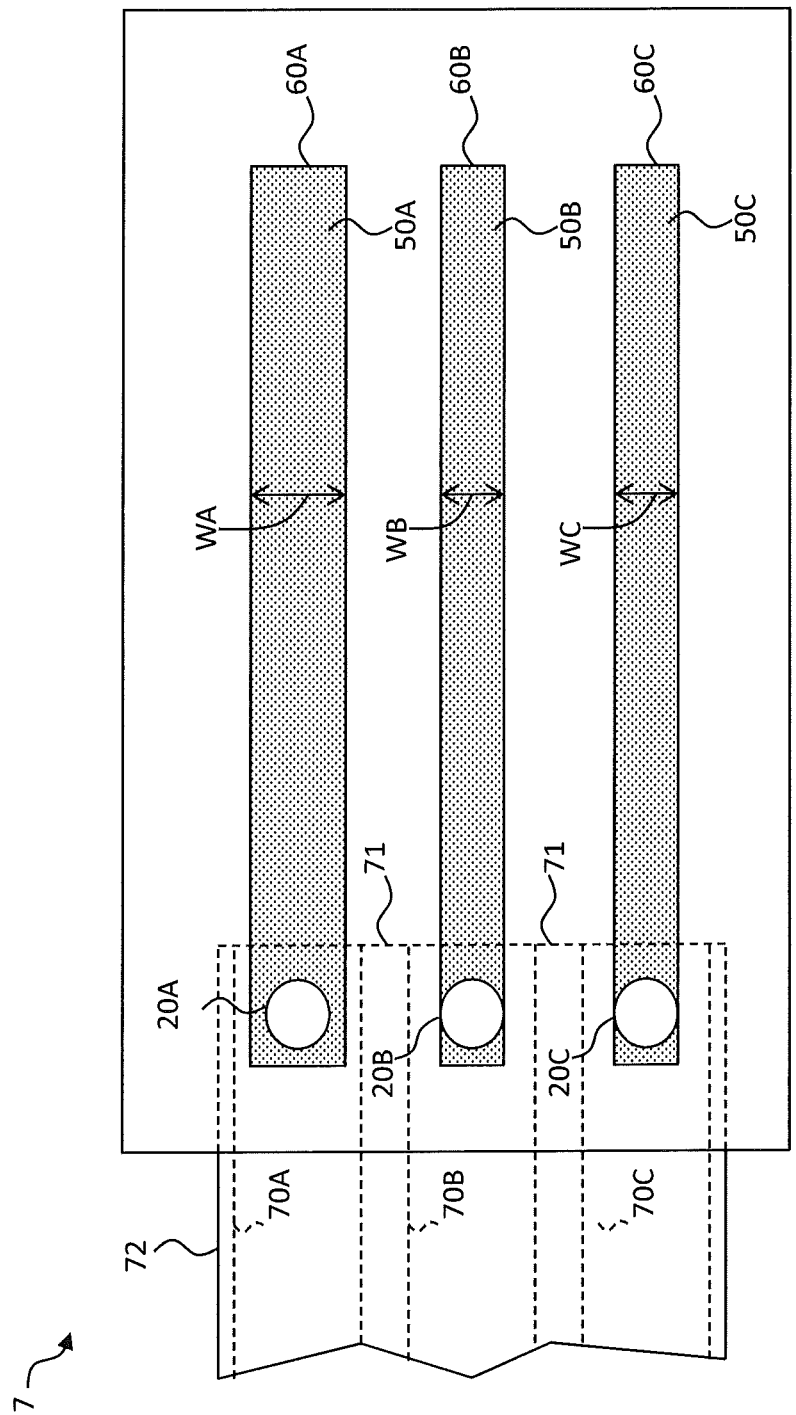
FIG. 15 is a plan view of an embodiment of the present invention including multiple conductive particles and electrical connectors in an electrical cable.

Referring to FIG. 15, in a further embodiment, a connection-pad structure 7 includes a plurality of electrical connectors 70A, 70B, 70C each part of a common electrical cable 72. Each electrical connector 70A, 70B, 70C is separated by electrically insulating separators 71 and is electrically connected to one or more conductive particles 20A, 20B, 20C in a different micro-channel 60A, 60B, 60C. Thus, each electrically separate micro-wire 50A, 50B, 50C is electrically connected to only one electrical connector 70A, 70B, 70C, respectively. Common electrical cable 72 can be, for example a ribbon cable; such cables are well known in the electrical arts. As shown in FIG. 15, first micro-channels 60A can have a different width WA than width WB of second micro-channel 60B or a width WC of third micro-channel 60C.

Figure 16:
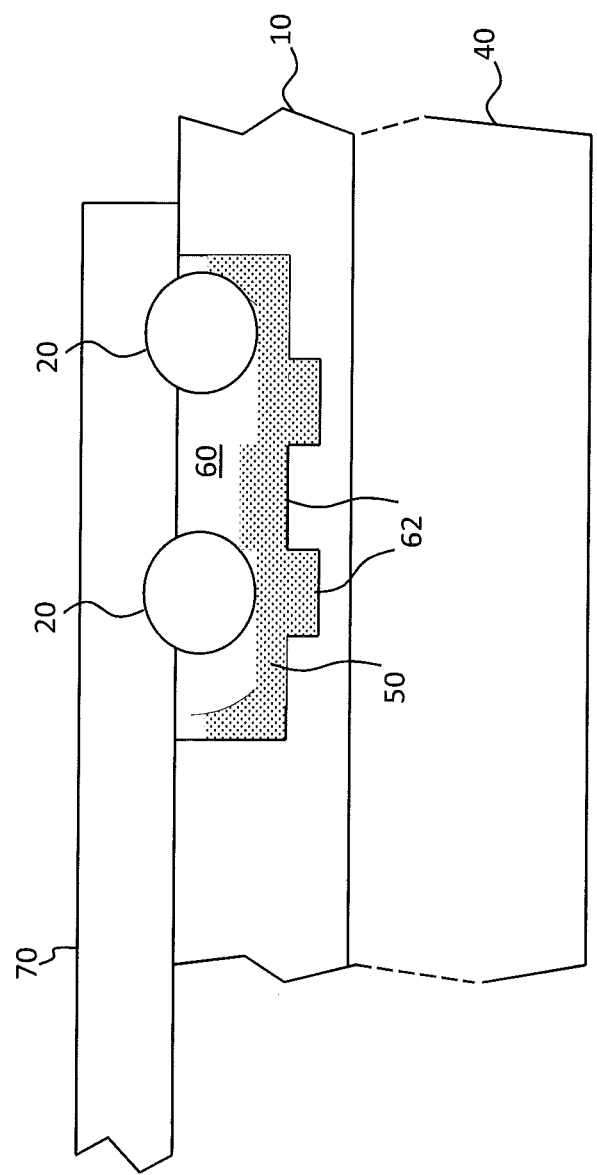
FIG. 16 is a cross section of an embodiment of the present invention including multiple conductive particles and an electrical connector.

As shown in FIG. 14 and further in FIG. 16, a plurality of conductive particles 20 is located in a common micro-channel 60 formed in cured layer 10 on substrate 40. Each conductive particle 20 is in electrical contact with a single micro-wire 50 in common micro-channel 60. Common micro-channel 60 can have micro-channel bottom 62 with different depths, as shown. Electrical connector 70 electrically connects to single micro-wire 50 through the plurality of conductive particles 20 in common micro-channel 60.

Figure 17:
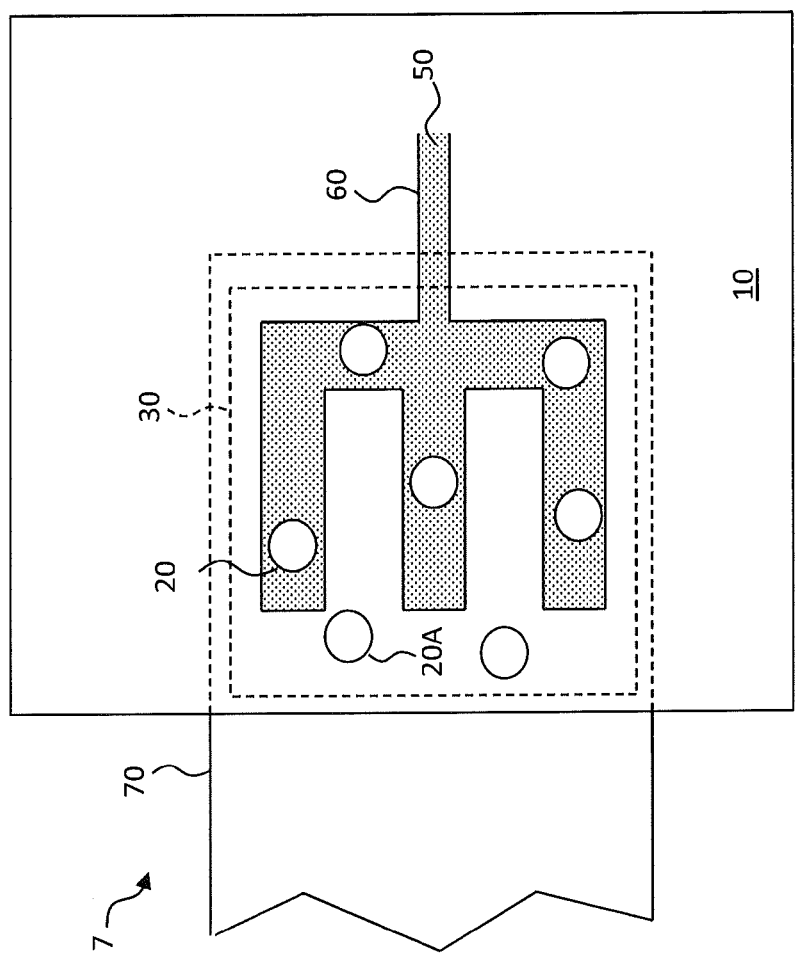
FIG. 17 is a plan view of an embodiment of the present invention including multiple conductive particles and an electrical connector in a connection pad.

Referring to FIG. 17, a group of intersecting micro-channels 60 with micro-wires 50 form a connection-pad structure 7 having a connection pad 30. Each of intersecting micro-channels 60 is formed in cured layer 10 on substrate 40 with micro-wire 50 as illustrated in FIG. 1 or using conventional micro-channels and micro-wires as are known in the art. Micro-wires 50 in intersecting micro-channels 60 form an electrically continuous micro-wire 50 as illustrated in FIG. 8A that is electrically connected to electrical connector 70. Micro-channels 60 and micro-wires 50 can have variable widths, as shown.

In one embodiment, micro-wire 50 is directly electrically connected to electrical connector 70 or using a conductive paste, such as a solder paste, as illustrated in FIG. 5. In an alternative embodiment, connection-pad structure 7 further includes a conductive particle 20, for example including metal or metal alloys, located in at least one of intersecting micro-channels 60 electrically connected to micro-wire 50 to provide electrical continuity between electrical connector 70 and micro-wire 50, as discussed with respect to FIG. 14. As shown in FIG. 14, conductive particles 20A, 20B of connection-pad structure 7 can extend to or above cured-layer surface 12. As also shown in FIG. 17, a plurality of conductive particles 20 is located in one or more of intersecting micro-channels 60 and each conductive particle 20 is electrically connected to micro-wire 50 and electrical connector 70. Intersecting micro-channels 20 can each have a width that is greater than a largest diameter of conductive particle 20.

In an embodiment, at least one conductive particle 20A electrically connected to electrical connector 70 is not electrically connected to a micro-wire. Thus, conductive particles 20 are affixed and in electrical contact with electrical connector 70 and then applied to connection pad 30 without regard to whether every conductive particle 20 is aligned with a micro-channel 60, thereby simplifying the electrical connection of electrical connector 70 with micro-wire 50 of each connection pad 30.

Figure 18:
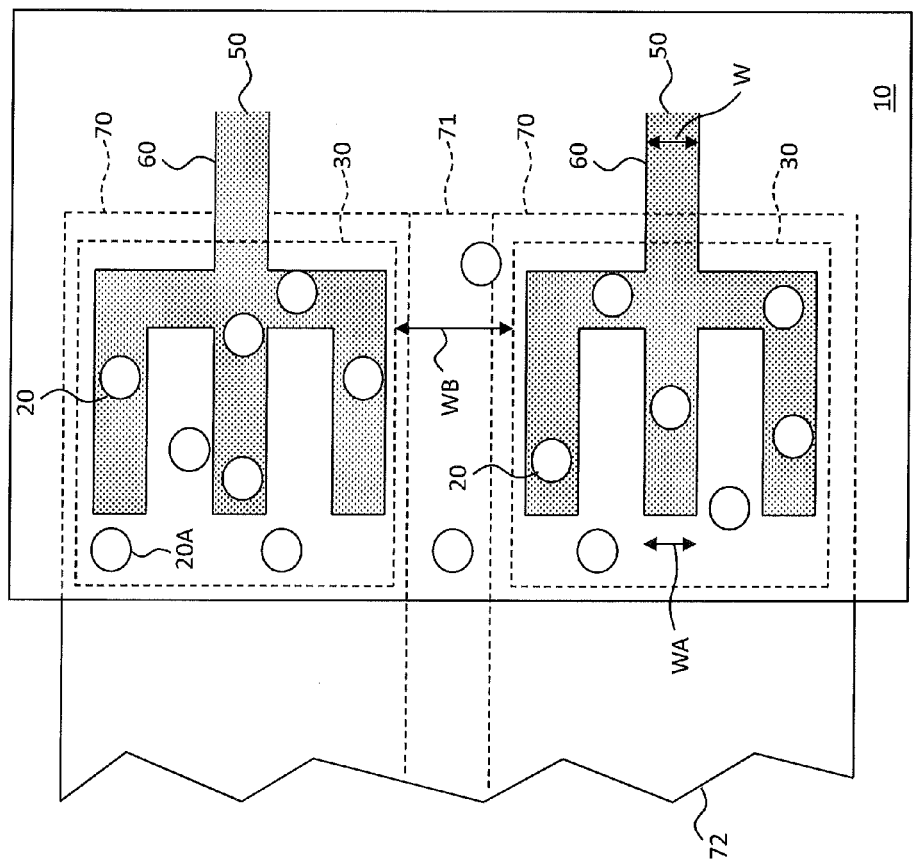
FIG. 18 is a plan view of an embodiment of the present invention including multiple conductive particles, electrical connectors, and connection pads.

Referring further to FIG. 18, in an embodiment a plurality of groups of intersecting micro-channels 60 is embossed in cured layer 10. As illustrated in FIG. 1, each micro-channel 60 extends from cured-layer surface 12 into cured layer 10 toward substrate 40. As shown in FIG. 18, each group of intersecting micro-channels 60 forms an electrically distinct connection pad 30, each connection pad 30 having one electrically continuous micro-wire 50 in intersecting micro-channels 60 of each connection pad 30. A plurality of electrically distinct electrical connectors 70 forms a common electrical cable 72. Each electrically distinct electrical connector 70 is electrically connected to micro-wire 50 in each corresponding connection pad 30 and is separated from other electrical connectors in common electrical cable 72 by electrically insulating separators 71.

In an embodiment, each of intersecting micro-channels 60 has a micro-channel width WA and connection pads 30 are spatially separated by a width WB greater than micro-channel width W. By separating connection pads 30 as specified, conductive particles 20 or 20A are unlikely to be large enough to electrically connect micro-wires 50 of adjacent connection pads 30, thereby preventing electrical shorts between electrical connectors 70 and micro-wires 50.

Each electrically distinct electrical connector 70 is aligned with a connection pad 30. In a further embodiment, electrical connectors 70 are separated by electrically insulating separators 71 that are wider than connection pads 30, thereby preventing a single electrical connector 70 from electrically connecting with two adjacent connection pads 30 (not shown).

As noted with respect to FIG. 17, each of a plurality of conductive particles 20 is located in at least one intersecting micro-channel 20 in each connection pad 30 in electrical contact with micro-wire 50 of each connection pad 30 and in electrical contact with electrical connector 70 corresponding to connection pad 30. Furthermore, at least one conductive particle 20A electrically connected to electrical connector 70 is not electrically connected to a micro-wire 50. Such a conductive particle 20A can be located on cured-layer surface 12 (not shown) between connection pads 30 or between intersecting micro-channels 60.

Intersecting micro-channels 60A, 60B can have different depths (e.g. as shown in FIGS. 6 and 7) or a single micro-channel 60 can have different depths (as shown in FIGS. 1-5). Furthermore, different micro-channels 60 can have different widths (as shown in FIGS. 6 and 7). At least one micro-channel width can be selected to accommodate conductive particles 20 to enable electrical connection between a micro-wire 50 and an electrical connector 70 and another, different micro-channel width can be selected to exclude conductive particles 20 to prevent electrical connection between a micro-wire 50 and an electrical connector 70.

Figure 19:
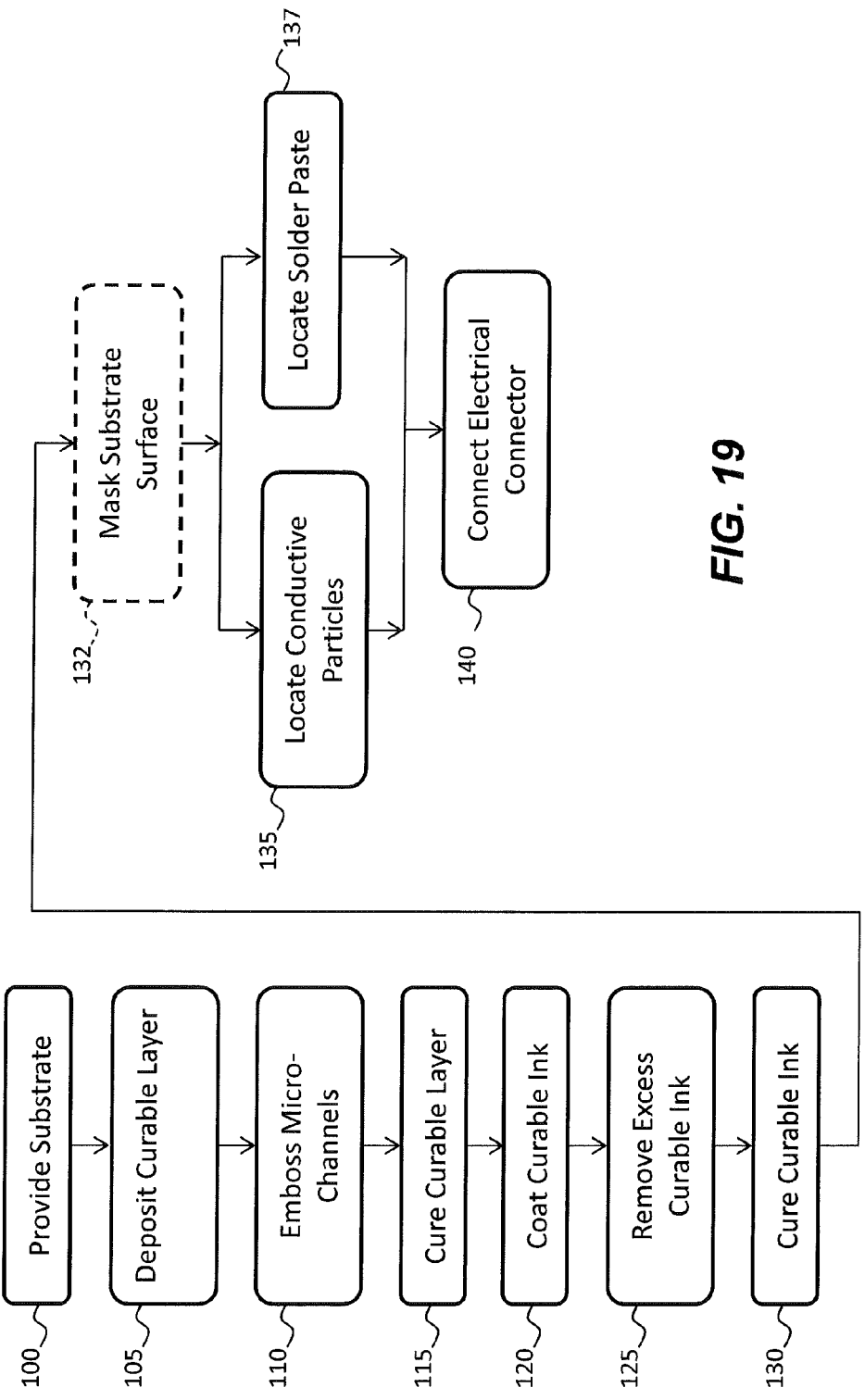
FIG. 19 is a flow diagram illustrating an embodiment of the present invention.

Referring to FIG. 19 and to FIG. 1, a method of making a micro-channel structure 5 according to an embodiment of the present invention includes providing 100 a substrate 40, depositing 105 a polymer curable layer 10 on first surface 41 of substrate 40. One or more micro-channels 60 are embossed 110 into curable layer 10. In one embodiment, different micro-channels 60 have different micro-channel depths (e.g. as shown in FIGS. 6-7). In another embodiment, a micro-channel 60 has different micro-channel depths (e.g. as shown in FIGS. 1-5). Curable layer 10 is cured 115 to form cured layer 10. Micro-channels 60 can form a group of intersecting micro-channels 60.

Curable ink is coated 120 over cured-layer surface 12 and micro-channels 60 of cured layer 10 and excess curable ink removed 125 from cured-layer surface 12 so that curable ink is only located in micro-channels 60. The curable ink is cured 130. The cured ink forms electrically conductive micro-wires 50 in micro-channels 60.

In an embodiment, substrate 40 is optionally masked 132 to prevent access to portions of substrate 40 and corresponding micro-channels 60. In one embodiment, conductive particles 20 are located 135 in any exposed micro-channels. In another embodiment, a conductive paste 76, such as a solder paste, is located 137 over exposed micro-channels 60. An electrical connector 70 is located in correspondence with micro-channels 60 and electrically connected 140 to micro-wires 50, for example by applying heat to solder electrical connector 70 to micro-wires 50 or to sinter or weld conductive particles 20 to electrical connector 70 and micro-wires 50. Conductive particles 20 or a conductive paste 76 can be located in electrical contact with micro-wires 50 before, after, or at the same time that conductive particles 20 or the conductive paste 76 are located in electrical contact with electrical connector 70. Likewise, conductive particles 20 or a conductive paste 76 can be electrically connected to micro-wires 50 before, after, or at the same time that conductive particles 20 or the conductive paste 76 are electrically connected to electrical connector 70 (e.g. by heating). Thus, conductive particles 20 or a conductive paste 76 can be first located in electrical contact with micro-wires 50 in micro-channels 60 and an electrical connector 70 then brought into contact with conductive particle 20 or the conductive paste 76. Alternatively, conductive particles 20 or a conductive paste 76 can be first located in electrical contact with electrical connector 70 and then brought into contact with micro-wires 50 in micro-channels 60.

According to various embodiments of the present invention, the curable ink includes electrically conductive nano-particles and curing step 130 sinters or agglomerates the electrically conductive nano-particles to form micro-wires 50. In other embodiments, the electrically conductive nano-particles are silver, a silver alloy, include silver, or have an electrically conductive shell.

In another embodiment, coating 120 the curable ink includes coating the curable ink in a liquid state and curing 130 the curable ink includes curing the curable ink into a solid state.

In yet another embodiment of the present invention, depositing 105 curable layer 10 includes depositing multiple sub-layers 11 in a common step and curing 115 multiple sub-layers 11 of curable layer 10 in a single step. In another embodiment of the present invention, single curable layer 10 is deposited, embossed, or cured before a second single curable layer 10 is deposited, embossed, or cured.

Conductive particles 20 can be located in exposed micro-channels 60 by applying a powder or slurry containing conductive particles 20 to cured-layer surface 12 where cured-layer surface 12 is not masked, for example by coating, spraying, or dropping the powder or slurry. Alternatively, the slurry or powder containing conductive particles 20 or conductive paste 76 is pattern-wise deposited, for example by ink-jet deposition, spraying, dropping, or screen-printing. Patterned deposition methods are known in the art. The slurry or powder containing conductive particles 20 can be mechanically agitated relative to substrate 40 to promote the location of conductive particles 20 in micro-channels 60.

In another embodiment, conductive particles 20 can be included in a conductive ink and applied with the conductive ink to desired micro-channel areas, either with pattern-wise deposition or by coating a masked cured-layer surface 12. Conductive inks typically include nano-particles. Conductive particles 20, as used herein, typically have a diameter of one to ten microns, or even larger, for example 20 or 50 microns. Hence, conductive particles 20 can be sintered to the conductive nano-particles of a conductive ink in the same step in which the conductive ink is cured.

In an embodiment, an applied conductive paste 76, upon heating, flows into a micro-channel 60 to electrically connect micro-wire 50 to electrical connector 70. Thus, micro-wire 50 need not extend to or above cured-layer surface 12 and an applied conductive paste 76 need not be in electrical contact with micro-wire 50 to electrically connect micro-wire 50 to electrical connector 70 as long as the conductive paste 76 is in the area of connection pad 30.

In various embodiments, connection-pad structures 7 and micro-channel structures 5 of the present invention are made by embossing a curable layer on a substrate 40 with micro-channels 60 that are at least partially filled with micro-wires 50. Micro-channels 60 are embossed in curable layer 10 with a stamp having a pattern of structures that are a reverse of micro-channels 60. In some embodiments, different micro-channels 60 have different depths or include portions with different depths. Such different-depth micro-channels 60 can be embossed into a curable layer in a single step using a stamp having multiple levels.

Figure 20:
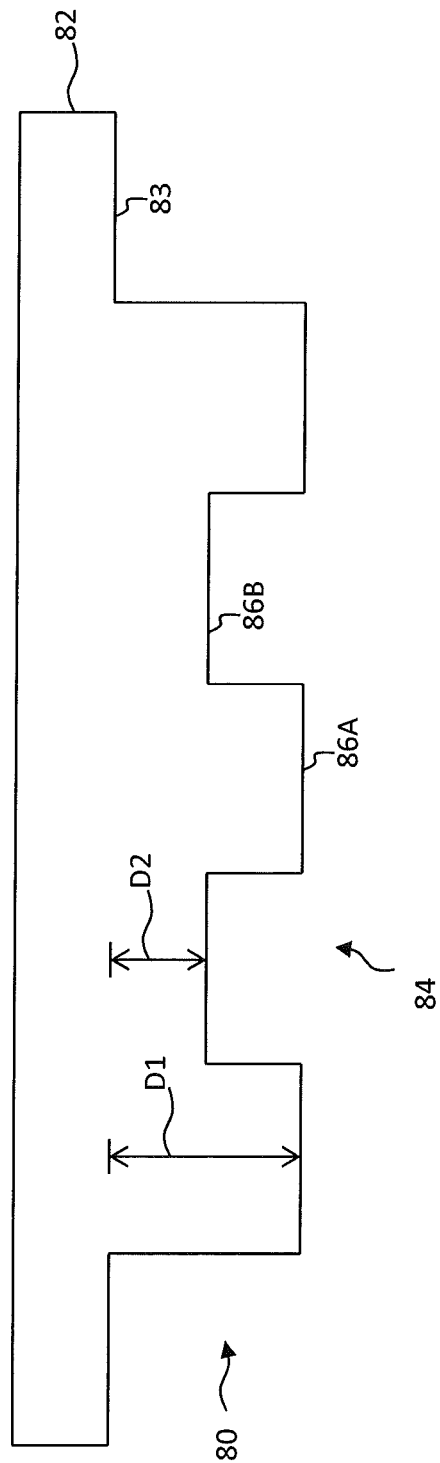
FIG. 20 is a cross section of an embossing stamp according to an embodiment of the present invention.

Referring to FIG. 20, a stamp 80 has a stamp substrate 82 and a bottom surface 84 with multiple first and second micro-channel depths D1 and D2 corresponding to a first stamp level 86A and a second stamp level 86B that embosses a micro-channel 60 approximately corresponding to micro-channel structure 5 of FIG. 5. Such a stamp 80 can also be termed a multi-level stamp 80 or a multi-depth stamp 80. The multiple levels do not include stamp substrate surface 83 of the stamp 80. The illustration of two levels does not limit the number of levels that can be constructed in multi-level stamp 80. The method disclosed herein for making such a multi-level stamp 80 can be extended to an arbitrary number of levels.

Figure 21A:
Figure 21B:
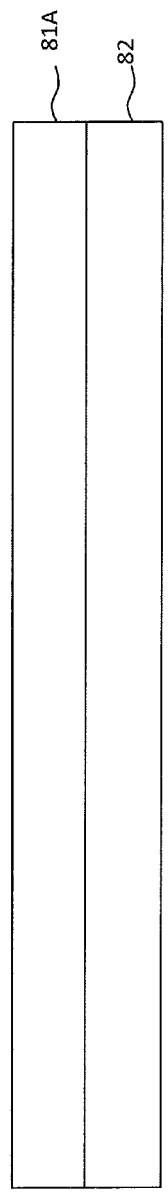
Figure 21C:
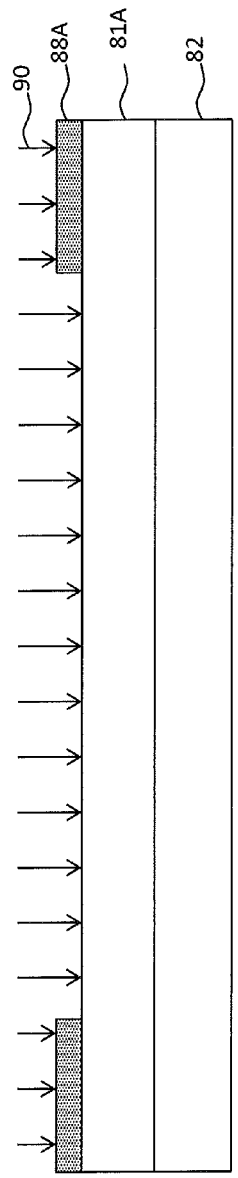
Figure 21D:
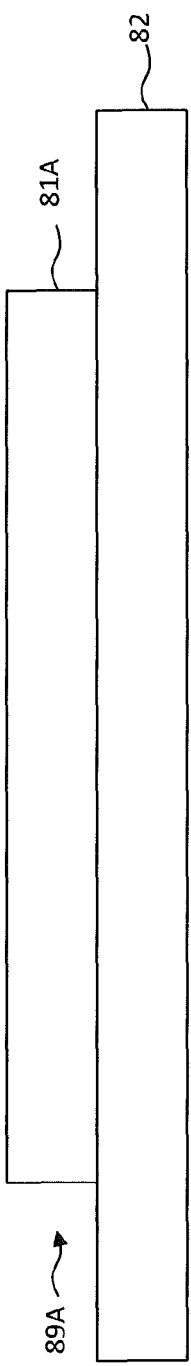
Figure 21E:
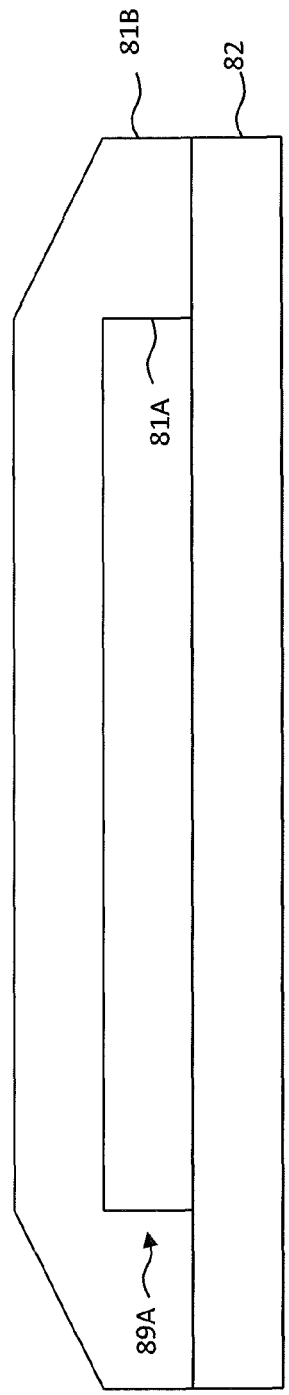
Figure 22:
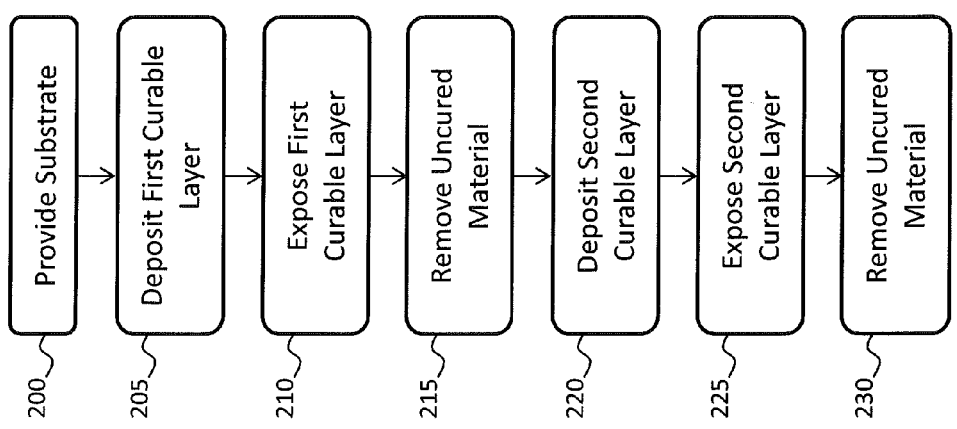
FIG. 22 is a flow diagram illustrating the steps of FIGS. 21A-21G in a corresponding an embodiment of the present invention.

Referring further to cross sectional FIGS. 21A-21G and the flow diagram of FIG. 22, a method of the present invention for constructing a multi-depth stamp 80 is described. Stamp substrate 82 is first provided 200 (FIG. 21A) and coated 205 with first stamp curable layer 81A (FIG. 21B). First stamp curable layer 81A on stamp substrate 82 is exposed 210 to radiation 90 (for example ultra-violet light) through first mask 88A to pattern-wise cure first stamp curable layer 81A (FIG. 21C). Uncured material is then removed 215 uncured material leaving first cured portions 89A (FIG. 21D). Patterned first stamp curable layer 81A is coated 220 with second stamp curable layer 81B (FIG. 21E). Second stamp curable layer 81B is exposed (FIG. 21F) 225 to radiation 90 through second mask 88B to pattern-wise cure second stamp curable layer 81B. Uncured material is then removed 230 (FIG. 21G) leaving second cured portions 89B to form multi-level stamp 80.

Second mask 88B is a subset of first mask 88A. Second mask 88B exposes only areas that have been exposed by first mask 88A. Thus, second cured portions 89B of second stamp curable layer 81B exposed through second mask 88B are a subset of first cured portions 89A of first stamp curable layer 81A that are exposed through first mask 88A. Furthermore, when second stamp curable layer 81B is coated over patterned first stamp curable layer 81A, second stamp curable layer 81B is coated over first cured portions 89A and portions of patterned first stamp curable layer 81A that were not cured. Thus, second stamp curable layer 81B is not pattern-wise deposited on only first cured portions 89A of patterned first stamp curable layer 81A.

The process described above can be repeated to make a multi-level stamp 80 having three or more levels. The curable material can be a cross-linkable polymer that links in response to ultra-violet radiation. The substrate 40 can be a polymer layer coated on a glass or plastic substrate.

FIGS. 21A-22 describe a method in which portions of a curable layer 10 are cured through direct exposure to radiation 90. As is known in the art, direct exposure to radiation 90 can also prevent curing of exposed portions of a layer. Thus, first and second masks 88A and 88B can be reversed so that uncured areas are exposed and cured areas are not. Curable materials having these various attributes are known in the art, for example polymers that are hardened through cross-linking agents sensitive to ultra-violet radiation or heat. In an embodiment of the present invention, first and second stamp curable layers (e.g. 81A, 81B) are only partially cured when they are pattern-wise exposed and are further cured as subsequent stamp curable layers are pattern-wise exposed. Such partial curing followed by further curing as further pattern-wise layers are cured provides for cross linking between the layers and improved adhesion between the layers.

Figure 23A:
Figure 23B:
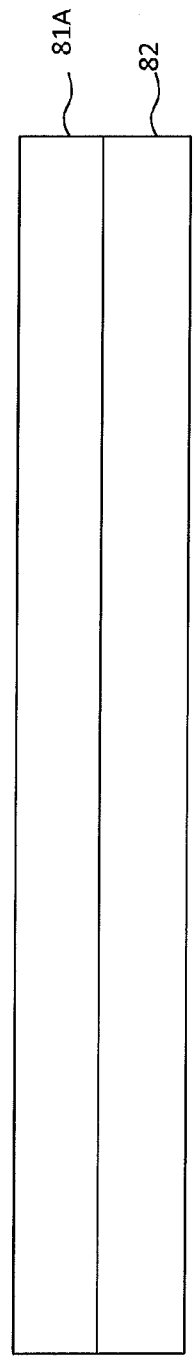
Figure 23C:
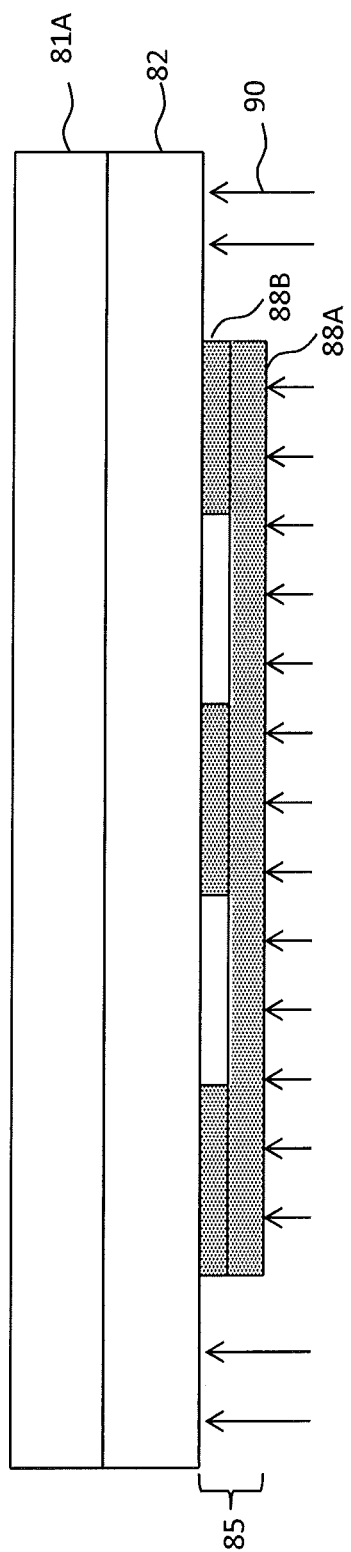
Figure 23F:
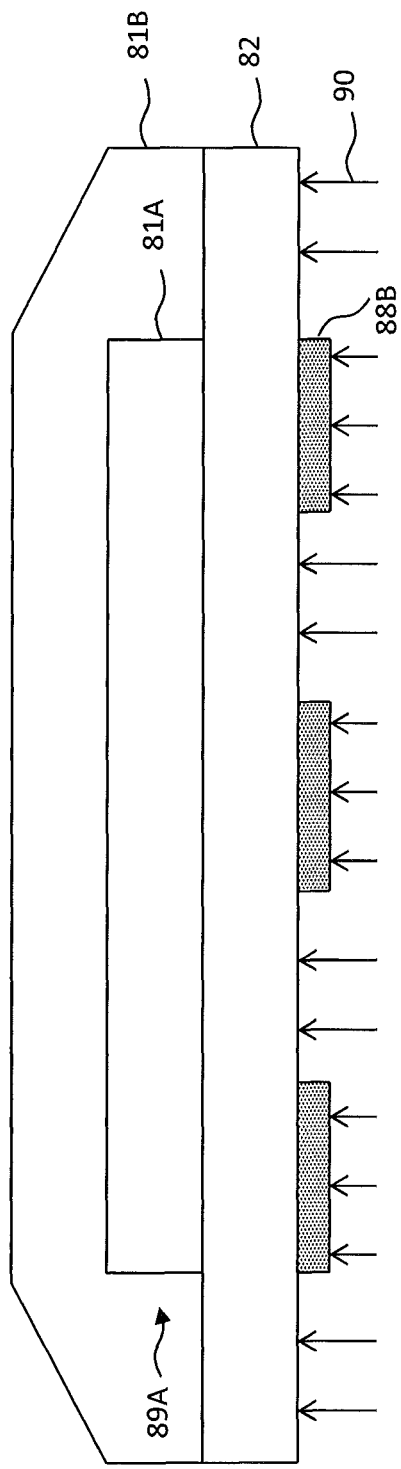

In an embodiment, illustrated in FIGS. 23A-23H, a multi-level embossing stamp 80 is made through repeated exposures through a stack of ordered masks. Referring to FIG. 23A, a transparent stamp substrate 82 is provided and coated with first stamp curable layer 81A (FIG. 23B). Referring to FIG. 23C, a set of first and second masks 88A, 88B are aligned with each other and stamp substrate 82 in a mask stack 85 having first mask 88A farthest from stamp substrate 82 and the masks in the stack ordered by area, with each mask defining an area that is a subset of the mask next farthest from stamp substrate 82. Radiation 90 exposes first stamp curable layer 81A through stamp substrate 82 to pattern-wise cure first stamp curable layer 81A and excess curable material removed to form patterned first cured portion 89A (FIG. 23D). First mask 88A in mask set 85 is then removed (FIG. 23E), leaving second stamp 88B in place. Second stamp curable layer 81B is then coated and radiation 90 provided to pattern-wise expose second stamp curable layer 81B (FIG. 23F). Uncured curable material is removed to form second cured portions 89B over first cured portions 89A formed on stamp substrate 82 (FIG. 23G). Second mask 88B is removed to provide multi-level stamp 80 (FIG. 23H). This method provides an advantage in that the masks in mask set 85 are aligned together and with stamp substrate 82 in one step and repeated mask alignments are not necessary, improving precision and accuracy. The formed embossing multi-level stamp 80 can then be used for embossing substrates as described above. The method can also be used to form a structured surface on a surface used for other tasks, such as a surface with micro-wires 50 formed thereon.

According to various embodiments of the present invention, substrate 40 is any material having a first surface 41 on which a cured layer 10 can be formed. Substrate 40 can be a rigid or a flexible substrate made of, for example, a glass, metal, plastic, or polymer material, can be transparent, and can have opposing substantially parallel and extensive surfaces. Substrates 40 can include a dielectric material useful for capacitive touch screens and can have a wide variety of thicknesses, for example 10 microns, 50 microns, 100 microns, 1 mm, or more. In various embodiments of the present invention, substrates 40 are provided as a separate structure or are coated on another underlying substrate, for example by coating a polymer substrate layer on an underlying glass substrate.

Substrate 40 can be an element of other devices, for example the cover or substrate of a display or a substrate, cover, or dielectric layer of a touch screen. According to embodiments of the present invention, micro-wires 50 extend across at least a portion of substrate 40 in a direction parallel to first surface 41 of substrate 40. In an embodiment, a substrate 40 of the present invention is large enough for a user to directly interact therewith, for example using an implement such as a stylus or using a finger or hand. Methods are known in the art for providing suitable surfaces on which to coat a single curable layer. In a useful embodiment, substrate 40 is substantially transparent, for example having a transparency of greater than 90%, 80% 70% or 50% in the visible range of electromagnetic radiation.

Electrically conductive micro-wires 50 and methods of the present invention are useful for making electrical conductors and busses for transparent micro-wire electrodes and electrical conductors in general, for example as used in electrical busses. A variety of micro-wire patterns can be used and the present invention is not limited to any one pattern. Micro-wires 50 can be spaced apart, form separate electrical conductors, or intersect to form a mesh electrical conductor on or in substrate 40. Micro-channels 60 can be identical or have different sizes, aspect ratios, or shapes. Similarly, micro-wires 50 can be identical or have different sizes, aspect ratios, or shapes. Micro-wires 50 can be straight or curved.

A micro-channel 60 is a groove, trench, or channel formed on or in substrate 40 extending from cured layer surface 12 toward first surface 41 of substrate 40 and having a cross-sectional width W less than 20 microns, for example 10 microns, 5 microns, 4 microns, 3 microns, 2 microns, 1 micron, or 0.5 microns, or less. In an embodiment, first and second depth D1 or D2 of micro-channel 60 is comparable to width W. Micro-channels 60 can have a rectangular cross section, as shown. Other cross-sectional shapes, for example trapezoids, are known and are included in the present invention. The width or depth of a layer is measured in cross section.

In various embodiments, cured inks can include metal particles, for example nano-particles. The metal particles can be sintered to form a metallic electrical conductor. The metal nano-particles can be silver or a silver alloy or other metals, such as tin, tantalum, titanium, gold, copper, or aluminum, or alloys thereof. Cured inks can include light-absorbing materials such as carbon black, a dye, or a pigment.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels 60 and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in micro-wire 50 formation process.

In various embodiments of the present invention, micro-channel 60 or micro-wire 50 has a width less than or equal to 10 microns, 5 microns, 4 microns, 3 microns, 2 microns, or 1 micron. In an example and non-limiting embodiment of the present invention, each micro-wire 50 is from 10 to 15 microns wide, from 5 to 10 microns wide, or from 5 microns to one micron wide. In some embodiments, micro-wire 50 can fill micro-channel 60; in other embodiments—wire 50 does not fill micro-channel 60. In an embodiment, micro-wire 50 is solid; in another embodiment micro-wire 50 is porous.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Micro-wires 50 can include a thin metal layer composed of highly conductive metals such as gold, silver, copper, or aluminum. Other conductive metals or materials can be used. Alternatively, micro-wires 50 can include cured or sintered metal particles such as nickel, tungsten, silver, gold, titanium, or tin or alloys such as nickel, tungsten, silver, gold, titanium, or tin. Conductive inks can be used to form micro-wires 50 with pattern-wise deposition or pattern-wise formation followed by curing steps. Other materials or methods for forming micro-wires 50, such as curable ink powders including metallic nano-particles, can be employed and are included in the present invention.

Electrically conductive micro-wires 50 of the present invention can be operated by electrically connecting micro-wires 50 through connection pads 30 and electrical connectors 70 to electrical circuits that provide electrical current to micro-wires 50 and can control the electrical behavior of micro-wires 50. Electrically conductive micro-wires 50 of the present invention are useful, for example in touch screens such as projected-capacitive touch screens that use transparent micro-wire electrodes and in displays. Electrically conductive micro-wires 50 can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D depth
D1 first micro-channel depth
D2 second micro-channel depth
D3 cured-layer depth
D4 conductive particle diameter
L micro-channel length
W width
WA width
WB width
5 micro-channel structure
7 connection-pad structure
10 curable/cured layer
11 sub-layer
12 cured-layer surface
20 conductive particle
20A conductive particle
20B conductive particle
20C conductive particles
21 elongated conductive particle
22 conductive shell
24 core
30 connection pad
40 substrate
41 first surface
42 opposing second surface
50 micro-wire
50A micro-wire
50B micro-wire
50C micro-wire
50D micro-wire
Parts List (Cont)
51A micro-wire portion
51B micro-wire portion
60 micro-channel
60A micro-channel
60B micro-channel
60C micro-channel
60D micro-channel
61A micro-channel portion
61B micro-channel portion
62 micro-channel bottom
62A micro-channel bottom
62B micro-channel bottom
63 micro-channel edge
64 first portion
66 second portion
70 electrical connector
70A electrical connector
70B electrical connector
70C electrical connector
71 electrically insulating separator
72 electrical cable
76 conductive paste
80 stamp
81A first stamp curable layer
81B second stamp curable layer
82 stamp substrate 83 stamp substrate surface
84 bottom surface
85 mask stack
86A first stamp level
86B second stamp level
Parts List (Cont)
88A first mask
88B second mask
89A first cured portions
89B second cured portions
90 radiation
100 provide substrate step
105 deposit curable layer step
110 emboss micro-channels step
115 cure curable layer step
120 coat curable ink step
125 remove excess conductive ink step
130 cure conductive ink step
132 mask substrate surface step
135 locate conductive particle step
137 locate solder paste step
140 electrically connect electrical connector step
200 provide substrate step
205 deposit first curable layer step
210 expose first curable layer step
215 remove uncured material step
220 coat second curable layer step
225 expose second curable layer step
230 remove uncured material step

The invention claimed is:

1. A micro-channel structure having variable depths, comprising:
   a substrate;
   a cured layer formed on the substrate, the cured layer having at least a first micro-channel and a separate second micro-channel different from the first micro-channel embossed therein, the first micro-channel having a bottom surface defining a first depth and the second micro-channel having a bottom surface defining a second depth different from the first depth; and
   a cured electrical conductor forming a micro-wire in each of the first and second micro-channels over their respective bottom surfaces, wherein the cured electrical conductor includes sintered or agglomerated electrically conductive nano-particles.

2. The micro-channel structure of claim 1, wherein the cured electrical conductor of the first or second micro-channel extends across the bottom surface of each micro-channel.

3. The micro-channel structure of claim 1, wherein the first micro-channel does not intersect the second micro-channel.

4. The micro-channel structure of claim 1, wherein the first micro-channel intersects the second micro-channel.

5. The micro-channel structure of claim 1, wherein the micro-wire formed in the first micro-channel is electrically connected to the micro-wire formed in the second micro-channel.

6. The micro-channel structure of claim 1, wherein the bottom surface of the first micro-channel is substantially parallel to a surface of the single-cured layer.

7. The micro-channel structure of claim 1, wherein the bottom surface of the second micro-channel is substantially parallel to a surface of the single-cured layer.

8. The micro-channel structure of claim 1, wherein the bottom surface of the first micro-channel is substantially parallel to the bottom surface of the second micro-channel.

9. The micro-channel structure of claim 1 wherein the depth of the micro-channel is in the range of about ten microns to two microns.

10. The micro-channel structure of claim 1 wherein the width of the micro-channel is in the range of about twelve microns to two microns.

11. The micro-channel structure of claim 1 wherein the thickness of the cured layer is in the range of about twelve microns to four microns.

12. The micro-channel structure of claim 1 wherein the micro-channel has a depth that is in a range of two microns to ten microns less than the cured layer thickness.

13. The method of claim 1 wherein the cured layer has multiple sub-layers.

14. The micro-channel structure of claim 1, further including an electrical connector electrically connected to the micro-wire.

15. The micro-channel structure of claim 14, wherein the electrical connector is soldered, sintered, or welded to the micro-wire.

16. A micro-channel structure having variable depths, comprising:
   a substrate;
   a cured layer formed on the substrate, the cured layer having at least a first micro-channel and a separate second micro-channel different from the first micro-channel embossed therein, the first micro-channel having a bottom surface defining a first depth and the second micro-channel having a bottom surface defining a second depth different from the first depth.

17. A micro-channel structure having variable depths, comprising:
   a substrate;
   a cured layer formed on the substrate, the cured layer having at least first and second micro-channels embossed therein, the first micro-channel having a bottom surface defining a first depth and the second micro-channel having a bottom surface defining a second depth different from the first depth; and
   a cured electrical conductor forming a micro-wire in each of the first and second micro-channels over their respective bottom surfaces; and
   wherein the first depth is greater than the second depth and the second micro-channel is wider than the first micro-channel.

18. A micro-channel structure having variable depths, comprising:
   a substrate;
   a cured layer formed on the substrate, the cured layer having at least first and second micro-channels embossed therein, the first micro-channel having a bottom surface defining a first depth and the second micro-channel having a bottom surface defining a second depth different from the first depth; and
   a cured electrical conductor forming a micro-wire in each of the first and second micro-channels over their respective bottom surfaces; and
   wherein the first depth is greater than the second depth and the first micro-channel is wider than the second micro-channel.

* * * * *